US006805974B2

(12) United States Patent
Choi et al.

(10) Patent No.: US 6,805,974 B2
(45) Date of Patent: Oct. 19, 2004

(54) LEAD-FREE TIN-SILVER-COPPER ALLOY SOLDER COMPOSITION

(75) Inventors: Won K. Choi, Mount Kisco, NY (US); Charles C. Goldsmith, Poughkeepsie, NY (US); Timothy A. Gosselin, Apalachin, NY (US); Donald W. Henderson, Ithaca, NY (US); Sung K. Kang, Chappaqua, NY (US); Karl J. Puttlitz, Sr., Wappingers Falls, NY (US); Da-Yuan Shih, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 170 days.

(21) Appl. No.: 10/078,020

(22) Filed: Feb. 15, 2002

(65) Prior Publication Data

US 2003/0156969 A1 Aug. 21, 2003

(51) Int. Cl.[7] .................. B23K 35/26; C22C 13/00; H01L 23/488
(52) U.S. Cl. .................. 428/646; 428/647; 428/648; 420/560; 420/557; 420/561; 257/780; 257/738; 228/180.22; 228/563
(58) Field of Search .................. 428/646, 647, 428/648; 148/400; 420/560, 557, 561; 257/780, 738; 228/180.22, 56.3

(56) References Cited

U.S. PATENT DOCUMENTS

| 2,105,405 | A | 1/1938 | Chase .................. 285/106 |
| 3,716,907 | A | 2/1973 | Anderson .................. 29/470.9 |
| 4,170,472 | A | 10/1979 | Olsen et al. .................. 75/175 A |
| 4,778,733 | A | 10/1988 | Lubrano et al. .................. 428/647 |

(List continued on next page.)

FOREIGN PATENT DOCUMENTS

| AU | 68124 | 7/1991 |
| EP | 0363740 | 4/1990 |
| GB | 131299 | 8/1919 |
| JP | 56017179 | 2/1981 |
| JP | 2001-138088 | * 5/2001 |

OTHER PUBLICATIONS

Moon et al., Experimental and Thermodynamic Assessment of Sn–Ag–Cu Solder Alloys, Journal of Electronic Materials, vol. 29, No. 10, 2000, pp. 1122–1136.
Hanson, M., Constitution of Binary Alloys, 1958, McGraw–Hill Book Company, 4 pages.
Bath, J. et al., Research Update: Lead–Free Solder Alternatives, vol. 11, No. 5, May 2000, Circuit Assembly, pp. 30–40.
YOR919950085, Kang et al., Flip Chip Interconnections Using Lead–Free Solders, 4 pages, no date.

*Primary Examiner*—John J. Zimmerman
(74) *Attorney, Agent, or Firm*—Schmeiser, Olsen & Watts; William H. Steinberg

(57) ABSTRACT

A solder composition and associated method of formation. The solder composition comprises a substantially lead-free alloy that includes tin (Sn), silver (Ag), and copper. The tin has a weight percent concentration in the alloy of at least about 90%. The silver has a weight percent concentration X in the alloy. X is sufficiently small that formation of $Ag_3Sn$ plates is substantially suppressed when the alloy in a liquefied state is being solidified by being cooled to a lower temperature at which the solid Sn phase is nucleated. This lower temperature corresponds to an undercooling $\delta T$ relative to the eutectic melting temperature of the alloy. Alternatively, X may be about 4.0% or less, wherein the liquefied alloy is cooled at a cooling rate that is high enough to substantially suppress $Ag_3Sn$ plate formation in the alloy. The copper has a weight percent concentration in the alloy not exceeding about 1.5%.

73 Claims, 17 Drawing Sheets

U.S. PATENT DOCUMENTS

| | | | |
|---|---|---|---|
| 4,806,309 A | 2/1989 | Tulman | 420/562 |
| 4,875,617 A | 10/1989 | Citowsky | 228/123 |
| 5,147,084 A | 9/1992 | Behun et al. | 228/56.3 |
| 5,221,038 A | 6/1993 | Melton et al. | 228/180.2 |
| 5,229,070 A | 7/1993 | Melton et al. | 420/557 |
| 5,255,839 A | 10/1993 | de Costa Alves et al. | 228/180.21 |
| 5,256,370 A | 10/1993 | Slattery et al. | 420/557 |
| 5,328,660 A | 7/1994 | Gonya et al. | 420/562 |
| 5,344,607 A | 9/1994 | Gonya et al. | 420/562 |
| 5,352,407 A | 10/1994 | Seelig et al. | 420/561 |
| 5,393,489 A | 2/1995 | Gonya et al. | 420/561 |
| 5,405,577 A | 4/1995 | Seelig et al. | 420/561 |
| 5,439,639 A | 8/1995 | Vianco et al. | 420/562 |
| 5,520,752 A | 5/1996 | Lucey, Jr. et al. | 148/400 |
| 5,527,628 A * | 6/1996 | Anderson et al. | 428/647 |
| 5,533,256 A | 7/1996 | Call et al. | 29/840 |
| 5,538,686 A | 7/1996 | Chen et al. | 420/557 |
| 5,580,520 A | 12/1996 | Slattery et al. | 420/557 |
| 5,655,703 A | 8/1997 | Jimarez et al. | 228/180.22 |
| 5,658,528 A | 8/1997 | Ninomiya et al. | 420/562 |
| 5,730,932 A | 3/1998 | Sarkhel et al. | 420/562 |
| 5,733,501 A | 3/1998 | Takao et al. | 420/562 |
| 5,833,921 A | 11/1998 | Paruchuri et al. | 420/589 |
| 5,837,191 A | 11/1998 | Gickler | 420/560 |
| 5,843,371 A | 12/1998 | Yoo et al. | 420/562 |
| 5,863,493 A | 1/1999 | Achari et al. | 420/557 |
| 5,874,043 A | 2/1999 | Sarkhel et al. | 420/557 |
| 5,918,795 A | 7/1999 | Yamaguchi et al. | 228/200 |
| 6,056,189 A | 5/2000 | Gao et al. | 228/207 |
| 6,077,477 A * | 6/2000 | Sakai et al. | 420/560 |
| 6,086,687 A | 7/2000 | Oud et al. | 148/400 |
| 6,156,132 A | 12/2000 | Yamashita et al. | 148/400 |
| 6,228,322 B1 | 5/2001 | Takeda et al. | 420/561 |
| 6,229,248 B1 | 5/2001 | Kusabiraki et al. | 310/348 |
| 6,517,602 B2 * | 2/2003 | Sato et al. | 75/255 |
| 2002/0018844 A1 * | 2/2002 | Kitajima et al. | 427/58 |
| 2002/0060582 A1 * | 5/2002 | Koyama et al. | 324/760 |
| 2002/0117539 A1 * | 8/2002 | Ito et al. | 228/254 |
| 2002/0159913 A1 * | 10/2002 | Ito et al. | 420/560 |

\* cited by examiner

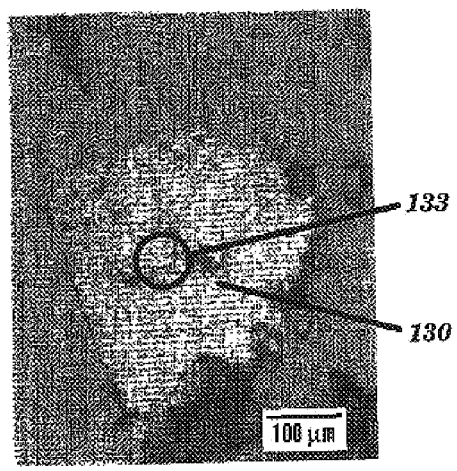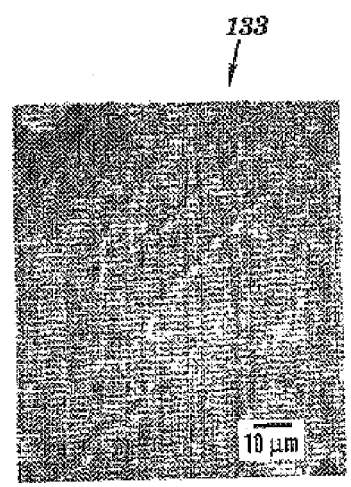
FIG. 13A
FIG. 13B

| SAC ALLOY | PASTY RANGE ($\Delta T = T_{LIQUIDUS} - T_{SOLIDUS}$) | |
|---|---|---|
|  | 0.7 Cu | 0.9 Cu |
| Sn2.1Ag x Cu | 3.5 | 15.7 |
| Sn2.3Ag x Cu | 3.3 | 17.3 |
| Sn2.5Ag x Cu | 2.6 | 17.3 |
| Sn2.7Ag x Cu | 2 | 17.3 |
| Sn2.9Ag x Cu | 1.6 | 17.3 |

*FIG. 14*

LEAD-FREE TIN-SILVER-COPPER ALLOY SOLDER COMPOSITION

BACKGROUND OF THE INVENTION

1. Technical Field

The present invention relates generally to a lead-free alloy solder composition and more specifically to a tin-silver-copper alloy solder composition.

2. Related Art

A chip carrier may be coupled to a circuit card by a ball grid array (BGA) comprising BGA solder balls. Such BGA solder balls have typically comprised a eutectic alloy composition of 63% tin (Sn) and 37% lead (Pb) which has a low melting temperature of 183° C. and is highly reliable. Unfortunately, lead is toxic and environmentally hazardous. As a result, lead-free solders are now beginning to be used commercially. However, many low-melt, lead-free solders have adverse physical characteristics which may cause reliability problems. Thus, there is a need for a reliable low-melt, substantially lead-free solder ball for coupling a chip or chip carrier to the next level of assembly (e.g., coupling a chip carrier to a circuit card).

SUMMARY OF THE INVENTION

In first embodiments, the present invention provides a solder composition, comprising a solder alloy, wherein the alloy is substantially free of lead, wherein the alloy includes tin (Sn), silver (Ag), and copper (Cu), wherein the tin has a weight percent concentration in the alloy of at least about 90%, wherein the silver has a weight percent concentration of X in the alloy, wherein X is sufficiently small that formation of $Ag_3Sn$ plates is substantially suppressed when the alloy in a liquefied state is being solidified by being cooled at to a lower temperature at which the solid Sn phase is nucleated, wherein the lower temperature corresponds to an undercooling $\delta T$ relative to the eutectic melting temperature of the alloy, and wherein the copper has a weight percent concentration in the alloy not exceeding about 1.5%.

In second embodiments, the present invention provides a method for forming an electrical structure, comprising:

providing a first substrate and a first solder ball attached to a first electrically conductive pad that is coupled to the first substrate, wherein the first solder ball comprises a solder alloy, wherein the alloy is substantially free of lead, wherein the alloy includes tin (Sn), silver (Ag), and copper (Cu), wherein the tin has a weight percent concentration in the alloy of at least about 90%, and wherein the copper has a weight percent concentration in the alloy not exceeding about 1.5%;

providing a second substrate and a second electrically conductive pad coupled to the second substrate;

coupling the first solder ball to the second pad;

melting the first solder ball by heating the first solder ball to form a modified solder ball; and solidifying the modified solder ball by cooling the modified solder ball to a lower temperature at which the solid Sn phase is nucleated, and wherein the lower temperature corresponds to an undercooling $\delta T$ relative to the eutectic melting temperature of the alloy, wherein the solidified modified solder ball is a solder joint that couples the first substrate to the second substrate, and wherein a silver weight percent concentration $X_2$ in the modified solder ball is sufficiently small that formation of $Ag_3Sn$ plates is substantially suppressed during said cooling.

In third embodiments, the present invention provides a method for forming a solder composition, comprising:

providing a solder alloy, wherein the alloy is substantially free of lead, wherein the alloy includes tin (Sn), silver (Ag), and copper (Cu), wherein the tin has a weight percent concentration in the alloy of at least about 90%, wherein the silver has a weight percent concentration in the alloy not exceeding about 4.0%, and wherein the copper has a weight percent concentration in the alloy not exceeding about 1.5%;

melting the alloy by heating the alloy; and solidifying the melted alloy by cooling the melted alloy at a cooling rate that is high enough to substantially suppress $Ag_3Sn$ plate formation in the alloy during said cooling.

In fourth embodiments, the present invention provides a method for forming an electrical structure, comprising:

providing a first substrate and a first solder ball attached to a first electrically conductive pad that is coupled to the first substrate, wherein the first solder ball comprises a solder alloy, wherein the alloy is substantially free of lead, wherein the alloy includes tin (Sn), silver (Ag), and copper (Cu), wherein the tin has a weight percent concentration in the alloy of at least about 90%, wherein the silver has a weight percent concentration in the alloy not exceeding about 4.0%, and wherein the copper has a weight percent concentration in the alloy not exceeding about 1.5%;

providing a second substrate and a second electrically conductive pad coupled to the second substrate;

coupling the first solder ball to the second pad;

melting the first solder ball by heating the first solder ball to form a modified solder ball; and solidifying the modified solder ball by cooling the modified solder ball at a cooling rate that is high enough to substantially suppress $Ag_3Sn$ plate formation in the modified solder ball during said cooling, wherein the solidified modified solder ball is a solder joint that couples the first substrate to the second substrate.

In fifth embodiments, the present invention provides a pre-soldering electrical structure, comprising:

a first substrate and a first solder ball attached to a first electrically conductive pad that is coupled to the first substrate, wherein the first solder ball comprises a solder alloy, wherein the alloy is substantially free of lead, wherein the alloy includes tin (Sn), silver (Ag), and copper (Cu), wherein the tin has a weight percent concentration in the alloy of at least about 90%, and wherein the copper has a weight percent concentration in the alloy not exceeding about 1.5%;

a second substrate and a second electrically conductive pad coupled to the second substrate, wherein the first solder ball is coupled to the second pad, wherein the first solder ball is adapted to being melted by being heated to form a modified solder ball, wherein the modified solder ball is adapted to being solidified by being cooled to a lower temperature at which the solid Sn phase is nucleated, wherein the lower temperature corresponds to an undercooling $\delta T$ relative to the eutectic melting temperature of the alloy, wherein the solidified modified solder ball is a solder joint that couples the first substrate to the second substrate, and wherein a silver weight percent concentration $X_2$ in the modified solder ball is sufficiently small that formation of Ag$_3$Sn plates are substantially suppressed during said cooling.

In sixth embodiments, the present invention provides a post-soldering electrical structure comprising:

a first substrate; and a second substrate, wherein the first substrate is coupled to the second substrate by a solder joint, wherein the solder joint comprises an alloy, wherein the alloy is substantially free of lead, wherein the alloy includes tin (Sn), silver (Ag), and copper (Cu), wherein the tin has a weight percent concentration in the alloy of at least about 90%, wherein the silver has a weight percent concentration in the alloy of $X_2$, wherein $X_2$ is sufficiently small that Ag$_3$Sn plates are substantially absent in the solder joint, and wherein the copper has a weight percent concentration in the alloy not exceeding about 1.5%.

The present invention provides a reliable low-melt, substantially lead-free solder ball for coupling a chip carrier to a circuit card, or for coupling an integrated circuit chip to a chip carrier.

BRIEF DESCRIPTION OF THE DRAWINGS

FIGS. 13A–3B are images of a silver-tin plate that remained after the majority tin component had been had been etched away from a Sn-3.8Ag-0.7Cu solder ball, in accordance with embodiments of the present invention.

FIG. 14 is a table showing pasty range variations as a function of copper concentration and silver concentration over a limited compositional range in a Sn—Ag—Cu system, in accordance with embodiments of the present invention.

DETAILED DESCRIPTION OF THE INVENTION

Figure 1A:
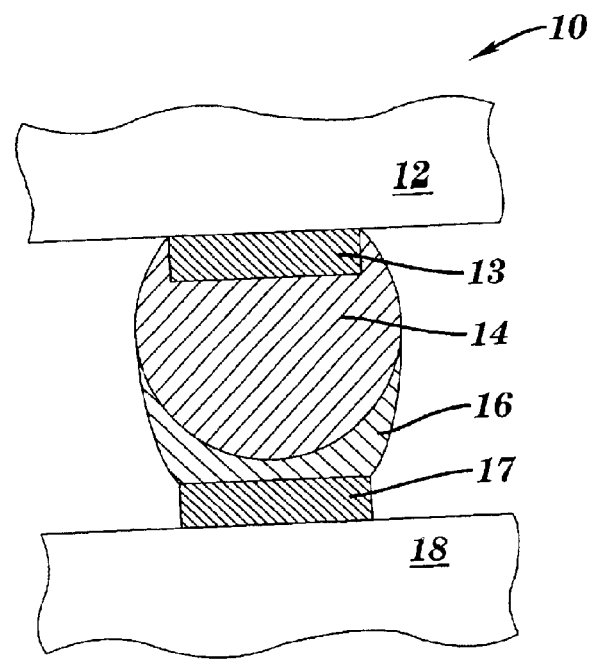
FIG. 1A depicts a cross-sectional view of an electronic structure, showing a first substrate in position for being soldered to a second substrate.

FIG. 1A depicts a cross-sectional view of an electrical structure (e.g., an electronic packaging structure) 10, showing a substrate 12 in position for being soldered to a substrate 18, in accordance with embodiments of the present invention. An electrically conductive pad ("pad") 13 is attached to the substrate 12, and a solder ball 14 is coupled to the pad 13. For example, the solder ball 14 may be in contact with the pad 13 (e.g., in metallurgical and/or electrical contact with the pad 13). Thus, the substrate 12, the pad 13, and the solder ball 14 are coupled together as a single mechanical unit. The solder ball 14 has been coupled to the pad 13 by any method known to a person of ordinary skill in the art such as, inter alia, by reflowing the solder ball 14 onto the pad 13, followed by cooling and thus solidifying the solder ball 14. A pad 17 is attached to the substrate 18, and a solder paste 16 has been applied to the pad 17 and is in contact with the pad 17. The substrate 12 is to be soldered to the substrate 18 by heating, melting, and reflowing the solder paste 16 and the solder ball 14 such that the melted and reflowed solder from the solder paste 16 is incorporated into the solder ball 14 to form the modified solder ball 15 of FIG. 1B. The modified solder ball 15 comprises the solder paste 16 as having been incorporated into the solder ball 14 during the aforementioned melting and reflowing of the solder paste 16 and the solder ball 14. After being cooled and solidified, the modified solder ball 15 serves as a solder joint that couples the substrate 12 to the substrate 18. In some embodiments, the joining of substrates 12 and 18 is performed without the use of the solder paste 16. In such embodiments, only flux is used to facilitate the joining process. In other embodiments, the solder paste 16 may be used to join substrates 12 and 18, wherein the solder ball 14 does not melt, but is wetted by the solder paste 16 solder under reflow conditions and provides for attachment upon solidification of the solder paste 16 solder. In FIG. 1A, the electrical structure 10 may be denoted as a "pre-soldering electrical structure."

Figure 1B:
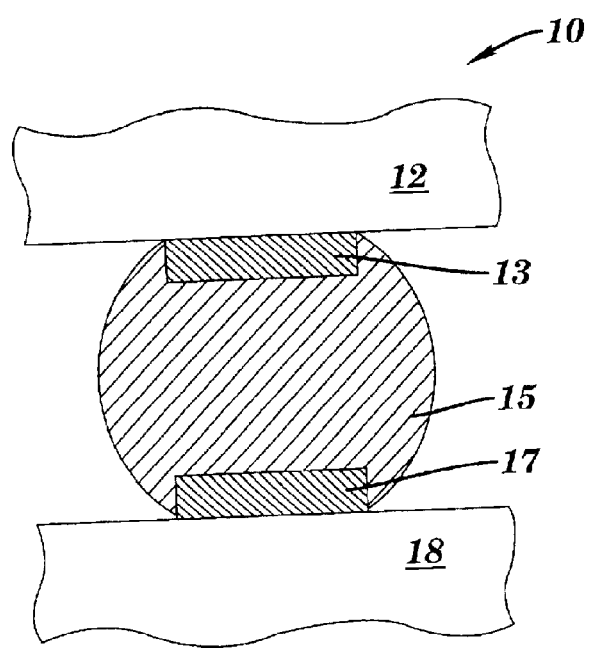
FIG. 1B depicts a cross-sectional view of the electronic structure of FIG. 1 after the first substrate has been soldered to the second substrate

FIG. 1B depicts a cross-sectional view of the electronic structure 10 of FIG. 1A after the substrate 12 has been soldered to the substrate 18 such that both the solder paste 16 and the solder ball 14 have been fully melted, in accordance with embodiments of the present invention. In FIG. 1B, the solidified modified solder ball 15 serves as a solder joint that couples the substrate 12 to the substrate 18. The modified solder ball 15 comprises the material of the solder ball 14 and the material of the solder paste 16 (see FIG. 1A). Generally, N solder balls mechanically and electrically couple the substrate 12 to the substrate 18, wherein $N \geq 1$, and wherein each of the N solder balls is typified by the modified solder ball 15. In FIG. 1B, the electrical structure 10 may be denoted as a "post-soldering electrical structure."

In an alternative embodiment, the solder paste 16 is not used and a flux is instead used in accordance with the present invention, using any flux material known to one of ordinary skill in the art, to couple the solder ball 14 to the pad 17. When the flux is used, the modified solder ball 15 includes essentially the material of the solder ball 14 and does not include any solder paste. In other alternative embodiments, neither flux nor the solder paste 16 is used to couple the solder ball 14 to the pad 17 in accordance with the present invention.

In FIGS. 1A and 1B, the substrates 12 and 18 may each comprise any electrical or electronic composite, laminate, component, etc. As a first example, the substrate 12 may comprise an integrated-circuit chip ("chip") and the substrate 18 may comprise a chip carrier (e.g., a ceramic or organic chip carrier). In chip attachment to a chip carrier, solder paste is typically not used. As a second example, the substrate 12 may comprise a chip carrier (e.g., a ceramic or organic chip carrier) and the substrate 18 may comprise a circuit card. In the second example, the solder ball 14 may be a Ball Grid Array ("BGA") solder ball. The solder pads 13 and 17 may each be any type of solder pad. and comprise any material or materials, known to one of ordinary skill in the art such as, inter alia, a copper pad, a nickel-gold plated copper pad ("nickel-gold pad"; i.e., a copper pad coated by a layer of nickel, and a layer of gold coating the layer of nickel), etc. The solder paste 16 may have any applicable composition (e.g., any applicable substantially lead-free composition) known to a person of ordinary skill in the art. For example, the solder paste 16 may comprise a solder paste composition by weight percent of: 3.5–4.0% silver, 0.5%–0.9% copper, and the remainder as essentially tin with possible additions of small or trace amounts of other constituents. As another example, the solder paste 16 may comprise a solder paste composition by weight percent of: 3.5–4.0% silver and the remainder as essentially tin with possible additions of small or trace amounts of other constituents.

For the present invention, the solder ball 14 comprises an alloy of tin (Sn), silver (Ag), and copper (Cu) having concentrations of Sn, Ag, and Cu ("SAC") that relate to commercial SAC alloy compositions and the ternary eutectic SAC alloy composition. Typically, commercial SAC alloy compositions comprise Sn-3.8Ag-0.7Cu (i.e., 3.8 weight percent Ag and 0.7 weight percent Cu) and Sn-4.0Ag-0.5Cu. Based on the best experimental information in the scientific literature, the ternary eutectic SAC alloy composition is Sn-αAg-βCu, wherein α is about 3.4 to 3.5, and wherein β is between about 0.8 to 0.9. SAC alloy compositions in this near ternary eutectic compositional range are leading lead-free candidate solders to replace the Sn-37Pb alloy that is currently and historically used in electronic component assembly processes.

For notational purposes, whenever the SAC alloy is expressed herein in the form Sn-αAg-βCu, it should be understood that α denotes the weight percent concentration of Ag in the SAC alloy and β denotes the weight percent concentration of Cu in the SAC alloy. The remainder of (100-α-β) percent of the SAC alloy, by weight, comprises essentially tin and possibly small or trace amounts of other constituents (e.g., bismuth or antimony as will be discussed infra). Similar notation with analogous interpretations will be used herein for other alloys than the SAC alloy, so that a coefficient of a component of an alloy (e.g., the coefficient α or 3.4 of the component Ag of the SAC alloy) denotes the weight percent concentration of the component in the alloy.

As will be demonstrated infra, the preceding SAC alloy compositions, when present in the modified solder ball 15 of FIG. 1B, include $Ag_3Sn$ ("silver-tin") plates which may promote fatigue cracking during execution of thermal transients such as during thermal cycle testing simulating field application conditions. The present invention prevents such silver-tin plates from forming, or limits the size of such silver-tin plates, by synergistically exploiting the kinetics in combination with the thermodynamics of phase transformations associated with solidification of the ternary SAC alloy from the liquid state after the SAC alloy has been melted by heating and reflow (melting). The following discussion summarizes aspects of relevant phase transformations that underlie the present invention.

The three phases produced upon full solidification of the liquid SAC alloy (upon cooling from a liquid state) are Sn, $Ag_3Sn$, and $Cu_6Sn_5$. For the purposes of this discussion, the ternary eutectic SAC alloy will be used as exemplifying the general behavior of all SAC alloys in this near eutectic compositional range. Upon cooling the liquid phase from temperatures above the melting point, non-equilibrium, kinetic effects intervene to preclude the simultaneous formation of all three phases at the melting point; i.e., to preclude a true eutectic phase transformation, because the equilibrium eutectic phase transformation is kinetically inhibited. The crystalline $Ag_3Sn$ phase is easily nucleated and forms with minimal undercooling (also called "supercooling") below the eutectic melting point of 217° C. of the ternary eutectic SAC alloy. This $Ag_3Sn$ phase, which is the first solid phase to form upon cooling to and below 217° C., has a plate-like growth morphology. These plates can grow rapidly in the surrounding liquid phase. The bulk of the liquid phase comprises Sn, and the Sn crystalline phase does not easily nucleate. The crystalline Sn phase requires substantial undercooling for nucleation from the liquid state. Undercoolings of 15 to 25° C. are typically required for the formation of the solid phase of Sn. During the time interval associated with the undercooling required for the nucleation of the crystalline Sn phase, the $Ag_3Sn$ plates can grow to a large size. In processing conditions with typical cooling rates of 0.2 to 0.3° C./sec, this cooling time interval can comprise tens of seconds and afford sufficient time for the $Ag_3Sn$ plates to grow to a large size. If the nucleation frequency for the $Ag_3Sn$ is low to the extent that only 1 or 2 plates are formed within the modified solder ball 15 of FIG. 1B, then these $Ag_3Sn$ plates can grow large enough to subtend the entire solder joint embodied by the modified solder ball 15. As will be shown infra, these $Ag_3Sn$ plates can adversely affect the thermomechanical fatigue properties of such solder joints, for both chip-to-chip carrier and chip carrier-to-circuit card solder joints. Failure analysis demonstrates that the failures are caused by strain localization at the interface between the $Ag_3Sn$ plates and the bounding solid Sn phase due to grain boundary sliding at this phase boundary. As will be shown infra, by altering the Ag concentration within the SAC alloy, the early nucleation and growth of the $Ag_3Sn$ phase can be prevented such that this early fatigue failure mechanism is defeated.

The present invention teaches how to totally, essentially, or substantially suppress formation of the $Ag_3Sn$ plates by either of two methods or by a combination of the two methods. The first method comprises reducing the weight percent concentration of Ag in the SAC alloy to a value below the eutectic weight percent concentration of Ag such that $Ag_3Sn$ plate formation is thermodynamically impossible until the undercooling required to nucleate the solid Sn phase is reached. The second method comprises cooling the totally liquid phase of the SAC alloy at a cooling rate that is fast enough to prevent any solidified $Ag_3Sn$ from growing to a size that would facilitate fatigue cracking of the modified solder ball 15 of FIG. 1B when the modified solder ball 15 is subject to cyclic or non-cyclic thermal transients (e.g., thermal cycle testing). FIGS. 2–15 provide test support for the preceding two methods. FIG. 16 provides a thermodynamic model that explains the first method and predicts the requisite maximum Ag weight percent concentration that suppresses $Ag_3Sn$ plate formation. Chronologically, the inventors of the present invention first developed the thermodynamic model and used the thermodynamic model to predict the requisite maximum Ag weight percent concentration as a function of undercooling below the eutectic melting temperature of 217° C. of the ternary eutectic SAC alloy. Then the inventors conducted tests that confirmed the predictions of the thermodynamic model. The test results of FIGS. 2–15 are discussed next, followed by a discussion of the thermodynamic model in accordance with FIG. 16.

Figure 2A:
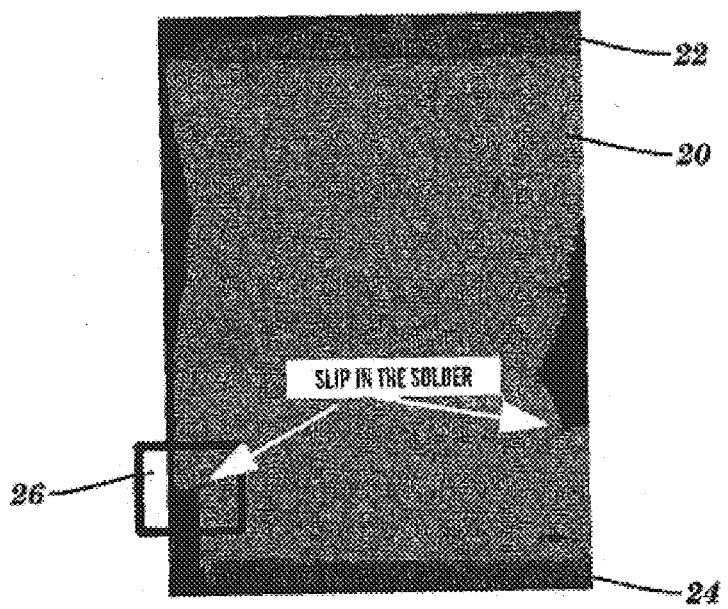
FIGS. 2A–2B depict cross-sectional images of a solder joint associated with a solder ball after the solder joint has been subject to thermal cycle testing.
Figure 2B:
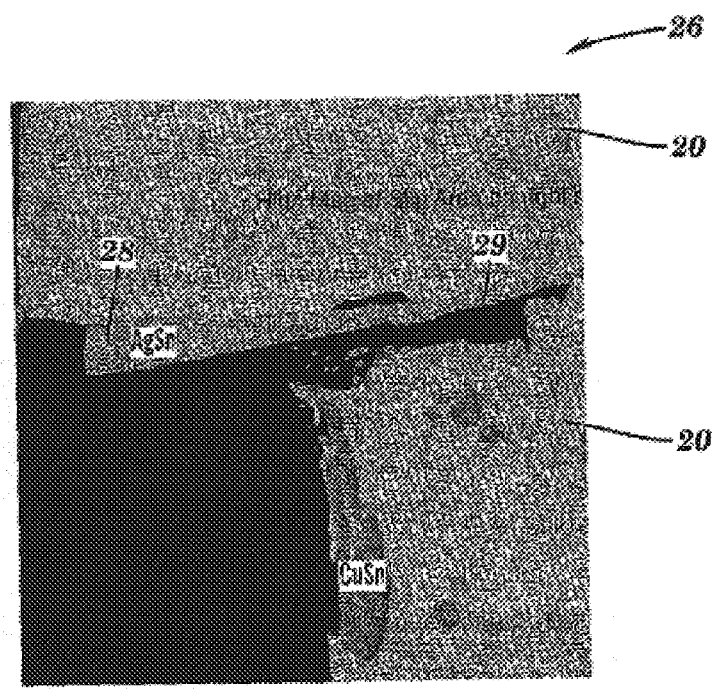

FIGS. 2A–2B depict cross-sectional images of a solder joint associated with a SAC alloy solder ball 20 after being subject to thermal cycle testing. In FIGS. 2A and 2B, the solder ball 20 is attached to a nickel-gold pad 22 to which a module (i.e., a chip carrier-chip package) had been attached. The solder ball 20 is also attached to a copper pad 24 to which a circuit card had been attached. The pads 22 and 24 each have a 28-mil linear dimension across the pad surface. The solder ball 20 comprised a Sn-3.8Ag-0.7Cu SAC alloy prior to its attachment to the copper pad 24. During attachment of the module to the circuit card, the solder ball 20 was formed with an estimated undercooling of about 15–25° C. based on thermocouple measurements using identical circuit card assemblies. The solder joint of solder ball 20 in FIGS. 2A and 2B is one of many similar solder joints, each of which having been subjected to 1000 to 2000 thermal cycles between 0° C. and 100° C. wherein the heating and cooling rates during thermal cycling from 100° C. to 0° C. were about 0.2° C./sec. The region 26 (shown in FIG. 2A and also in a blown-up view in FIG. 2B) shows localized deformation in the joint structure of the solder ball 20. The joint structure has a column-like appearance after attachment to both pads 22 and 24, as shown in FIG. 2A. Because of the coefficient of thermal expansion ("CTE") difference between the module and the card, the solder joint is subject to a cyclic strain within each thermal cycle. After the thermal cycling, some of the solder joints were cross-sectioned to determine the mechanisms for failure. The cross section shown in FIGS. 2A and 2B does not show failure of the joint, but does show localized deformation (i.e., formation of crack 29) in the region 26 where a $Ag_3Sn$ plate 28 subtends a major fraction of the cross section of the joint. The localized deformation has occurred right at the surface of the plate by initially grain boundary sliding between the silver-tin in the metallic phase and the bounding tin-rich phase. This failure mechanism in some joint structures may lead to early failure such as an electrical open.

Figure 3A:
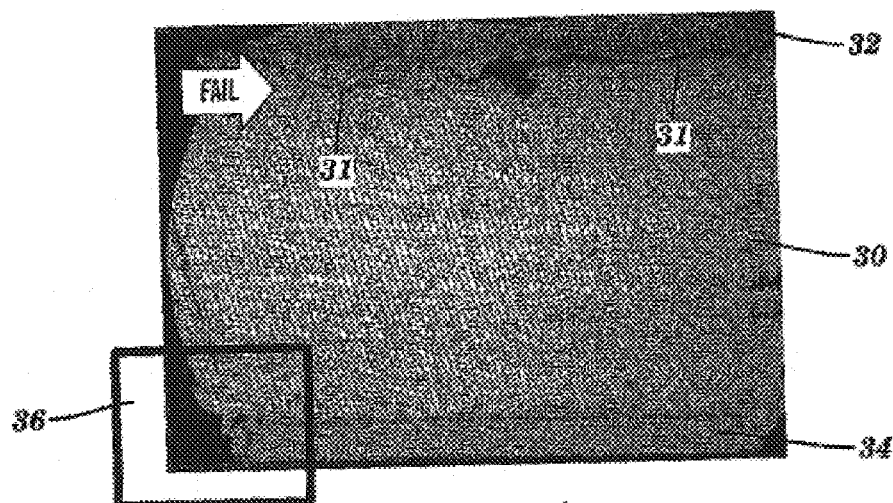
FIGS. 3A–3B depict cross-sectional images of a solder joint associated with a ball grid array (BGA) solder ball after the solder joint has been subject to thermal cycle testing.
Figure 3B:
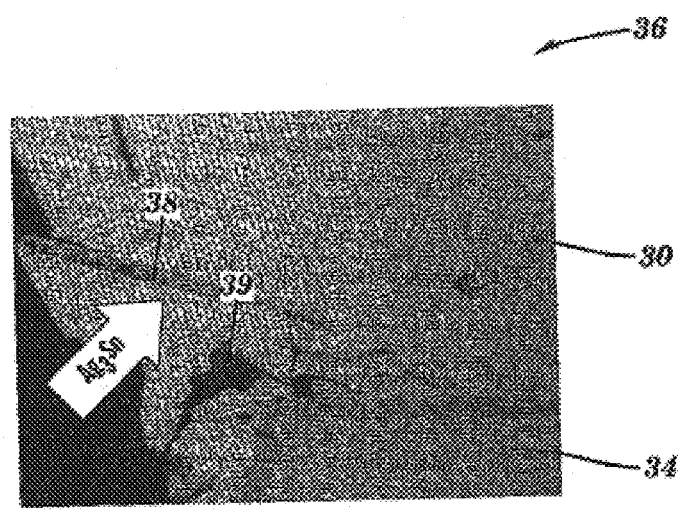

FIGS. 3A–3B depict cross-sectional images of a solder joint associated with a ball grid array (BGA) SAC alloy solder ball 30 after being subject to thermal cycle testing. In FIGS. 3A and 3B, the solder ball 30 is attached to a nickel-gold pad 32 to which a module had been attached. The solder ball 30 is also attached to a nickel-gold pad 34 to which a circuit card had been attached. The pads 32 and 34 each have a 28-mil linear dimension across the pad surface. The solder ball 30 comprised a Sn-3.8Ag-0.7Cu SAC alloy prior to its attachment to the nickel-gold pad 34. During attachment of the module to the circuit card, the solder ball 30 was formed at a cooling rate of 0.7–0.9° C./sec with an estimated undercooling of about 15–25° C. based on thermocouple measurements using identical circuit card assemblies. The solder joint in FIGS. 3A and 3B is one of many similar solder joints, each of which having been subjected to 1500–2500 thermal cycles between 0° C. and 100° C. wherein the heating and cooling rates during thermal cycling from 100° C. to 0° C. were about 0.2° C./sec. The region 36 (shown in FIG. 3A and also in an enlarged view in FIG. 3B) shows localized deformation in the joint structure of the solder ball 30. A fatigue failure 31 occurred near the pad 32, and there was no fatigue failure near the pad 34, which is consistent with the fact that the CTE differential between the solder ball module was much larger than the CTE differential between the solder ball and the circuit card. Near the pad 34, FIGS. 3A and 3B provide evidence that the $Ag_3Sn$ plate 38 can augment the fatigue cracking initiation process. The $Ag_3Sn$ plate 38 is an intermetallic structure that has grown near the pad 34 from a side of the ball 30. Due to the fatigue processes, there has been a strain localization at the surface of the $Ag_3Sn$ plate 38 giving rise to a deformation-induced-void-like structure 39 at a corner of the pad 34, and a crack growing from this void-like structure into the bulk of the ball 30. This shows augmentation of the crack initiation and fatigue processes, which is the primary wearout mechanism for solder joints. The solder joint failure 31 was not caused by the $Ag_3Sn$ plate 38 as discussed supra.

Figure 3C:
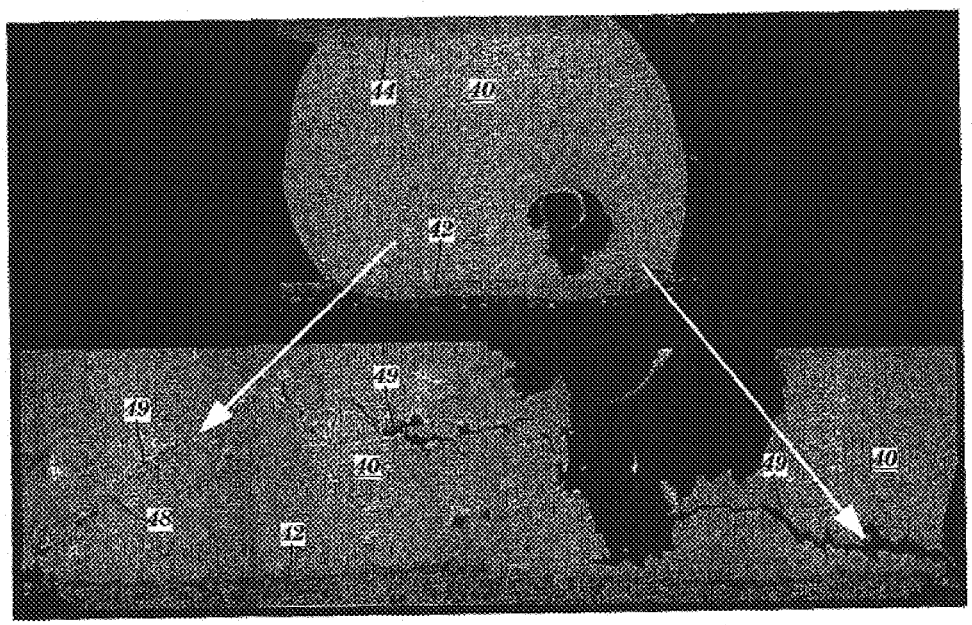
FIG. 3C depicts cross-sectional images of a solder joint associated with a BGA solder ball, showing crack propagation along a silver-tin plate in the solder ball following thermal cycle testing of the solder joint.

FIG. 3C depicts a cross-sectional image of a solder joint associated with a BGA SAC alloy solder ball 40, showing crack propagation along a $Ag_3Sn$ plate 48 in the solder ball 40 following thermal cycle testing of the solder joint. In FIG. 3C, the solder ball 40 is attached to a nickel-gold pad 42 to which a module had been attached. The solder ball 40 is also attached to a copper pad 44 to which a circuit card had been attached. The pads 42 and 44 each had a 28-mil linear dimension across the pad surface. The solder ball 40 comprised a Sn-3.8Ag-0.7Cu SAC alloy prior to its attachment to the nickel-gold pad 42. During attachment of the module to the circuit card, the solder ball 40 was formed at a cooling rate of 0.7–0.9° C./sec with an estimated undercooling of about 15–25° C. based on thermocouple measurements using identical circuit card assemblies. The solder joint in FIG. 3C had been subjected to 2114 thermal cycles between 0° C. and 100° C. wherein the heating and cooling rates during thermal cycling from 100° C. to 0° C. were approximately 0.2° C./sec. FIG. 3C illustrates propagation of a crack 49 along the surface of the $Ag_3Sn$ plate 48 and continued propagation of the crack 49 through the entire width of solder ball 40 such that the crack 49 constitutes a failure in the form of an electrical open circuit.

In, summary, FIGS. 2A–2B, 3A–3B, and 3C illustrates a correlation between the existence Ag$_3$Sn plates in SAC alloy solder balls and crack formation and/or fatigue failure in the solder balls following thermal cycling such as, inter alia, thermal cycle testing. Thus, it is desirable to prevent or severely inhibit the formation of Ag$_3$Sn plates in SAC alloy solder balls. FIGS. 4–15 provides testing support for the methods of the present invention for preventing or severely inhibiting the formation of Ag$_3$Sn plates in SAC alloy solder balls.

Figure 4A:
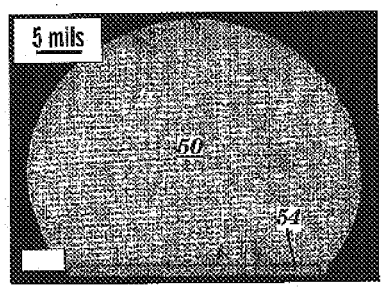
FIGS. 4A–4D depict cross-sectional images of a Sn-3.8Ag-0.7Cu solder ball after being reflow-soldered to a nickel-gold pad at cooling rates spanning 0.2 to 3.0° C./sec, in accordance with embodiments of the present invention.
Figure 4B:
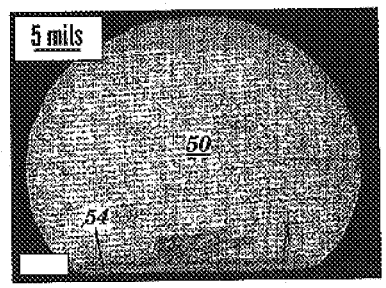
Figure 4C:
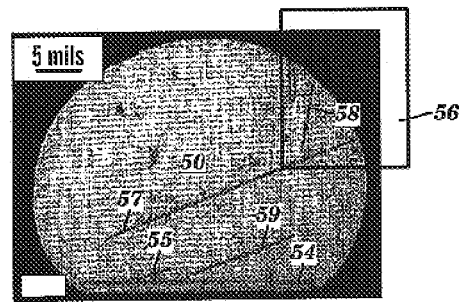
Figure 4D:
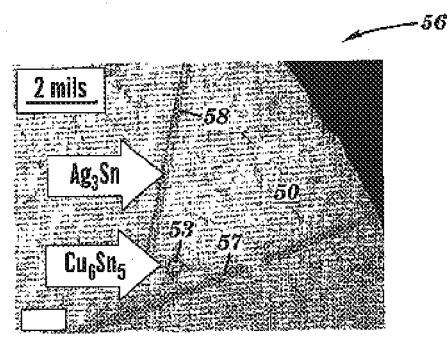

FIGS. 4A–4D are cross-sectional images of a SAC alloy solder ball 50 after being soldered to a nickel-gold pad 54 at cooling rates of 3.0° C./sec, 1.2° C./sec, and 0.2° C./sec in FIGS. 4A, 4B, and 4C, respectively, in accordance with embodiments of the present invention. FIG. 4D is an enlarged view of the region 56 in FIG. 4C. The solder ball 50 comprised a Sn-3.8Ag-0.7Cu SAC alloy prior to its attachment to the pad 54. The pad 54 has a 25-mil linear dimension across the pad 54 surface. The peak temperature of the solder ball 50 during a melting reflow process was 240° C., and the undercooling relative to 217° C. was estimated to be in the range of about 15–25° C. for FIGS. 4A–4D, based on thermocouple measurements using identical or analogous circuit card assemblies. FIGS. 4A an 4B show at most very small Ag$_3$Sn plates at the 3.0 and 1.2° C./sec cooling rates, respectively. FIGS. 4C–4D shows Ag$_3$Sn plates 55, 57, 58, and 59 wherein the Ag$_3$Sn plate 57 spans almost the entire length across the solder ball 50. FIG. 4D also shows a Cu$_6$Sn$_5$ structure 53 in the form of a distorted hexagonal rod with round hole in the center of the distorted hexagon. Thus, FIGS. 4A–4D show that Ag$_3$Sn plates are suppressed or of a very small size in the Sn-3.8Ag-0.7Cu SAC alloy solder ball 50 when the cooling rate is at least 1.2° C./sec, but is not suppressed and may be large when the cooling rate is 0.2° C./sec.

Note that the linear length scale on FIGS. 4A–4C is indicated by the "5 mils" text at the upper left corner of each Figure, which denotes that 5 mils of true length corresponds to the length of the line segment directly under the "5 mils" text. Similarly in FIG. 4D, the linear length scale is indicated by the "2 mils" text at the upper left corner of FIG. 4D, which denotes that 2 mils of true length corresponds to the length of the line segment directly under the "2 mils" text. Similar scale indications appear in FIGS. 5–11 and 13, described infra.

Figure 5A:
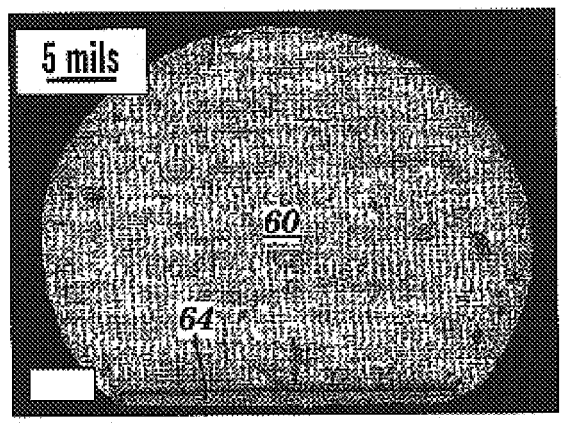
FIGS. 5A–5C depict cross-sectional images of a Sn-3.4Ag-0.9Cu solder ball after being reflow-soldered to a nickel-gold pad at cooling rates spanning 0.2 to 3.0° C./sec, in accordance with embodiments of the present invention.
Figure 5B:
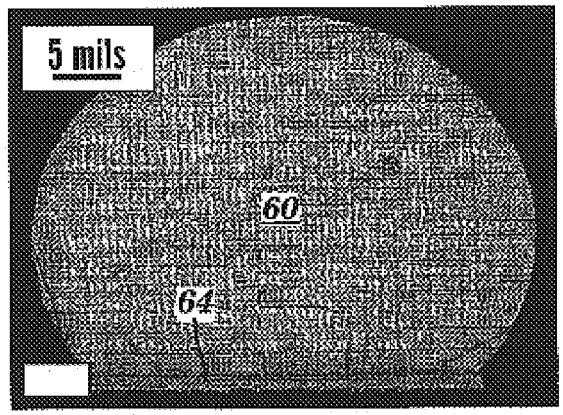
Figure 5C:
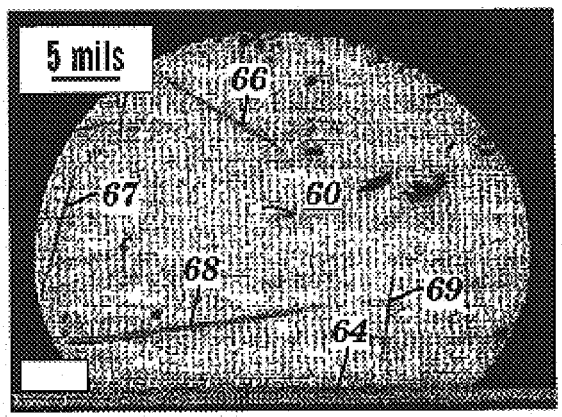

FIGS. 5A–5C are cross-sectional images of a SAC alloy solder ball 60 after being soldered to a nickel-gold pad 64 at cooling rates of 3.0° C./sec, 1.2° C./sec, and 0.2° C./sec in FIGS. 5A, 5B, and 5C, respectively, in accordance with embodiments of the present invention. The solder ball 60 comprised a Sn-3.4Ag-0.9Cu SAC alloy prior to its attachment to the pad 64. The pad 64 has a 25-mil linear dimension across the pad 64 surface. The undercooling relative to 217° C. was estimated to be in the range of about 15–25° C. for FIGS. 5A–5C, based on thermocouple measurements using identical or analogous circuit card assemblies. FIGS. 5A an 5B show at most very small Ag$_3$Sn plates at the 3.0 and 1.2° C./sec cooling rates, respectively. FIG. 5C shows large Ag$_3$Sn plates 66, 67, 68, and 69. Thus, FIGS. 5A–5C show that Ag$_3$Sn plates are suppressed or of a very small size in the Sn-3.4Ag-0.9Cu SAC alloy solder ball 60 when the cooling rate is at least 1.2° C./sec, but is not suppressed and may be large when the cooling rate is 0.2° C./sec.

Figure 6A:
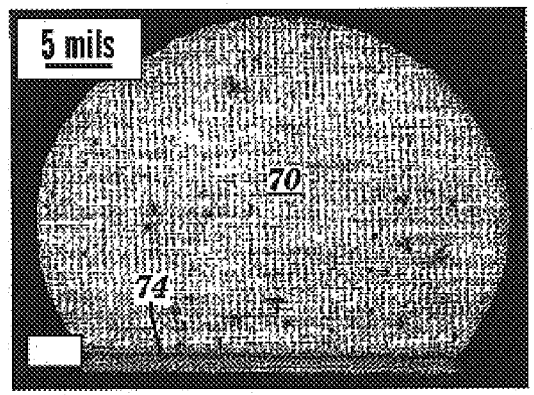
FIGS. 6A–6C depict cross-sectional images of a Sn-3.2Ag-0.9Cu solder ball after being reflow-soldered to a nickel-gold pad at cooling rates spanning 0.2 to 3.0° C./sec, in accordance with embodiments of the present invention.
Figure 6B:
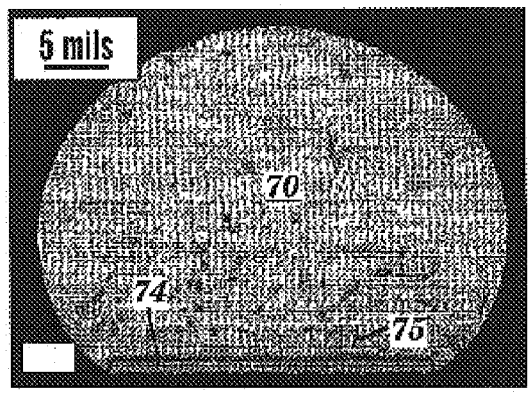
Figure 6C:
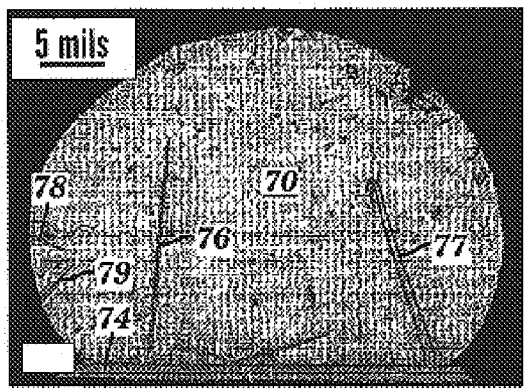

FIGS. 6A–6C are cross-sectional images of a SAC alloy solder ball 70 after being reflow-soldered to a nickel-gold pad 74 at cooling rates of 3.0° C./sec, 1.2° C./sec, and 0.2° C./sec in FIGS. 6A, 6B, and 6C, respectively, in accordance with embodiments of the present invention. The solder ball 70 comprised a Sn-3.2Ag-0.9Cu SAC alloy prior to its attachment to the pad 74. The pad 74 has a 25-mil linear dimension across the pad 74 surface. The estimated undercooling relative to 217° C. was in the range of about 15–25° C. for FIGS. 6A–6C, based on thermocouple measurements using identical or analogous circuit card assemblies. FIGS. 6A an 6B show at most very small Ag$_3$Sn plates at the 3.0 and 1.2° C./sec cooling rates, respectively. FIG. 6C shows large Ag$_3$Sn plates 76 and 77. FIGS. 6B and 6C shows small Ag$_3$Sn plates 75, 78 and 79, wherein the Ag$_3$Sn plates 75, 78 and 79 may be small enough not to facilitate fatigue cracking of the solder ball 70 when the solder ball 70 is subject to cyclic or non-cyclic thermal transients (e.g., thermal cycle testing). Thus, FIGS. 6A–6C show that Ag$_3$Sn plates are suppressed or of a very small size in the Sn-3.2Ag-0.9Cu SAC alloy solder ball 70 when the cooling rate is at least 1.2° C./sec, but is not suppressed and may be large when the cooling rate is 0.2° C./sec.

Figure 7A:
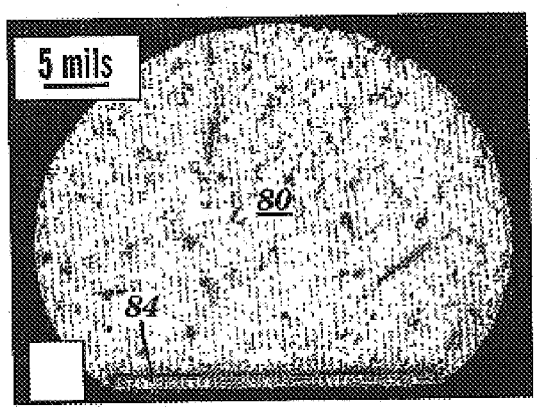
FIGS. 7A–7C depict cross-sectional images of a Sn-2.5Ag-0.9Cu solder ball after being reflow-soldered to a nickel-gold pad at cooling rates spanning 0.2 to 3.0° C./sec, in accordance with embodiments of the present invention.
Figure 7B:
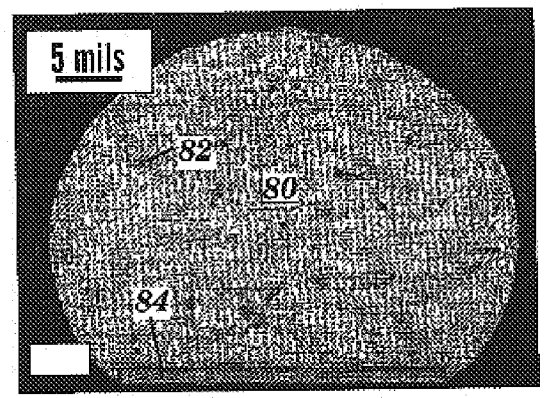
Figure 7C:
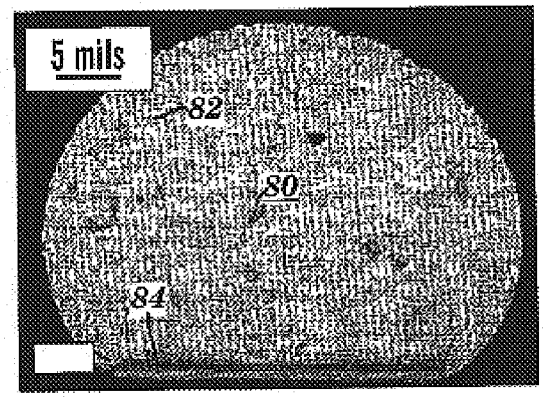

FIGS. 7A–7C are cross-sectional images of a SAC alloy solder ball 80 after being reflow-soldered to a nickel-gold pad 84 at cooling rates of 3.0° C./sec, 1.2° C./sec, and 0.2° C./sec in FIGS. 7A, 7B, and 7C, respectively, in accordance with embodiments of the present invention. The solder ball 80 comprised a Sn-2.5Ag-0.9Cu SAC alloy prior to its attachment to the pad 84. The pad 84 has a 25-mil linear dimension across the pad 84 surface. The estimated undercooling relative to 217° C. was estimated to be in the range of about 15–25° C. for FIGS. 7A–7C, based on thermocouple measurements using identical or analogous circuit card assemblies. FIGS. 7A, 7B, and 7C each show at most very small Ag$_3$Sn plates at each of the three cooling rates of 3.0, 1.2, and 0.2° C./sec, respectively. The Ag$_3$—Sn is solidified not as plates but is dispersed in a striation structure as particulates between the majority tin phase, which shows up in FIGS. 7A–7C as background, light grey striations 82. The dispersed intermetallic compound structure, comprising Ag$_3$Sn and Cu$_6$Sn5 particulates, is quite homogeneous and therefore less susceptible to stress than are the Ag$_3$Sn plates. Thus, FIGS. 7A–7C show that Ag$_3$Sn plates are suppressed or of a very small size in the Sn-2.5Ag-0.9Cu SAC alloy solder ball 80 when the cooling rate is in the range of 0.2 to 3.0° C./sec. Note that essentially the same results of Ag$_3$Sn plate suppression were obtained for the same test as is shown in FIGS. 7A–7C, except that the Ag concentration was 2.7% instead of 2.5%.

Figure 8A:
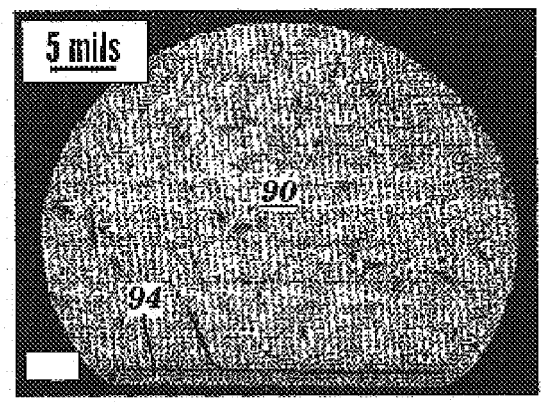
FIGS. 8A–8C depict cross-sectional images of a Sn-2.1Ag-0.9Cu solder ball after being reflow-soldered to a nickel-gold pad at cooling rates spanning 0.2 to 3.0° C./sec, in accordance with embodiments of the present invention.
Figure 8B:
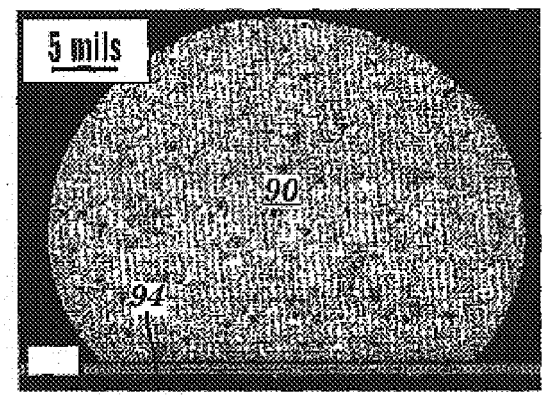
Figure 8C:
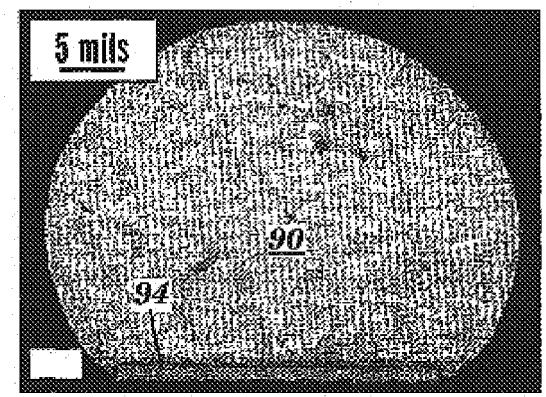

FIGS. 8A–8C are cross-sectional images of a SAC alloy solder ball 90 after being reflow-soldered to a nickel-gold pad 94 at cooling rates of 3.0° C./sec, 1.2° C./sec, and 0.2° C./sec in FIGS. 8A, 8B, and 8C, respectively, in accordance with embodiments of the present invention. The solder ball 90 comprised a Sn-2.1Ag-0.9Cu SAC alloy prior to its attachment to the pad 94. The pad 94 has a 25-mil linear dimension across the pad 94 surface. The undercooling relative to 217° C. was estimated to be in the range of about 15–25° C. for FIGS. 8A–8C, based on thermocouple measurements using identical or analogous circuit card assemblies. FIGS. 8A, 8B, and 8C each show at most very small Ag$_3$Sn plates at each of the three cooling rates of 3.0, 1.2, and 0.2° C./sec, respectively. The Ag$_3$—Sn is solidified not as plates but is dispersed in a striation structure as has been discussed supra in conjunction with FIGS. 7A–7C. Thus, FIGS. 8A–8C show that Ag$_3$Sn plates are suppressed or of a very small size in the Sn-2.1Ag-0.9Cu SAC alloy solder ball 90 when the cooling rate is in the range of 0.2 to 3.0° C./sec.

In summary, FIGS. 4–8 show that Ag$_3$Sn plate formation in a SAC alloy solder ball attached to a substrate (e.g., a circuit card or a chip carrier) is "substantially suppressed" if the Ag concentration in the solder ball is 2.7% or less irrespective of the cooling rate, or if the cooling rate is at least 3.0° C./sec irrespective of the Ag concentration; and $Ag_3Sn$ plate formation in a SAC alloy solder ball attached to a substrate may not be substantially suppressed if the Ag concentration in the solder ball is 3.2% or more with cooling rates of 1.2° C./sec or less. Definitionally, $Ag_3Sn$ plate formation in a solder ball (or in a solder joint) is "substantially suppressed" if there is no $Ag_3Sn$ plate formation in the solder ball (or in the solder joint), or if any formed $Ag_3Sn$ plate is small enough so as not to facilitate fatigue cracking of the solder ball (or solder joint) when the solder ball (or solder joint) is subject to cyclic or non-cyclic thermal induced stresses (e.g., during thermal cycle testing). As an example, the $Ag_3Sn$ plates 75, 78 and 79 of FIGS. 6B and 6C are small enough so as not to facilitate said fatigue cracking, while large $Ag_3Sn$ plates 76 and 77 of FIG. 6C are large enough to facilitate said fatigue cracking. The cutoff Ag concentration below which $Ag_3Sn$ plate formation is substantially suppressed depends on the magnitude of the undercooling as will be explained infra in conjunction with the thermodynamic model of FIG. 16. Thus, the cutoff Ag concentration may lie typically somewhere between 2.7% Ag and 3.2% Ag depending on the magnitude of the undercooling. The cutoff Ag concentration can be determined by one of ordinary skill in the art without undue experimentation by performing tests of the type associated with FIGS. 4–8.

Definitionally, $Ag_3Sn$ plate formation in a solder ball (or in a solder joint) is "essentially suppressed" if there is essentially no $Ag_3Sn$ plate formation in the solder ball (or in the solder joint). FIGS. 4–8 show that $Ag_3Sn$ plate formation in a SAC alloy solder ball attached to a substrate (e.g., a circuit card or a chip carrier) is "essentially suppressed" if the Ag concentration in the solder ball is 2.7% or less substantially irrespective of the cooling rate, or if the cooling rate is at least 3.0° C./sec substantially irrespective of the Ag concentration.

Additionally, FIGS. 4–8 show that $Ag_3Sn$ plate formation in a SAC alloy solder ball attached to a substrate (e.g., a circuit card or a chip carrier) is substantially suppressed, substantially independent of the Ag concentration, if the cooling rate is sufficiently high (i.e., at least about 3.0° C./sec). Thus, $Ag_3Sn$ plate formation could be substantially suppressed with sufficiently high cooling rates, even if commercial SAC alloy compositions (i.e., 3.8Ag–4.0Ag) or the ternary eutectic SAC alloy composition (i.e., 3.4Ag) is used. Since $Ag_3Sn$ plate formation is not substantially suppressed at a cooling rate of 1.2° C./sec or less, there is a threshold cooling rate, between 1.2 and 3.0° C./sec, above which $Ag_3Sn$ plate formation is substantially suppressed. The threshold cooling rate is a function of the composition of the SAC alloy and the available heterogeneous nuclei which foster the nucleation of the solid Sn phase. The threshold cooling rate can be determined by one of ordinary skill in the art without undue experimentation by performing tests of the type associated with FIGS. 4–8.

Figure 9A:
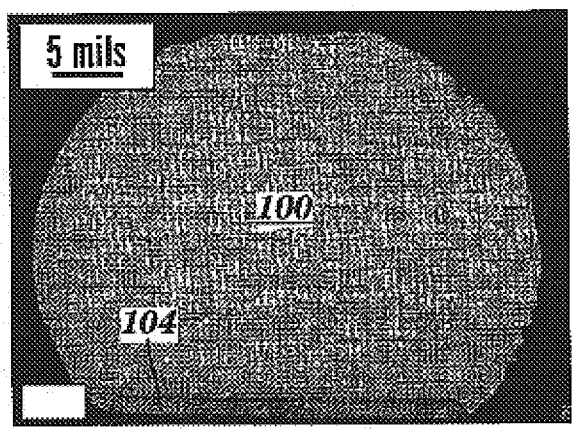
FIGS. 9A–9C depict cross-sectional images of a Sn-3.5Ag solder ball after being reflow-soldered to a nickel-gold pad at cooling rates spanning 0.2 to 3.0° C./sec, in accordance with embodiments of the present invention.
Figure 9B:
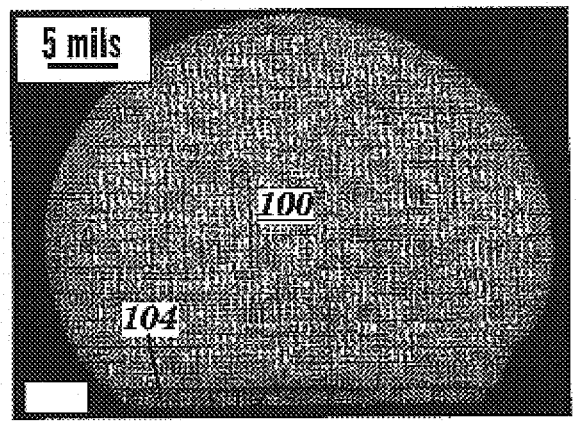
Figure 9C:
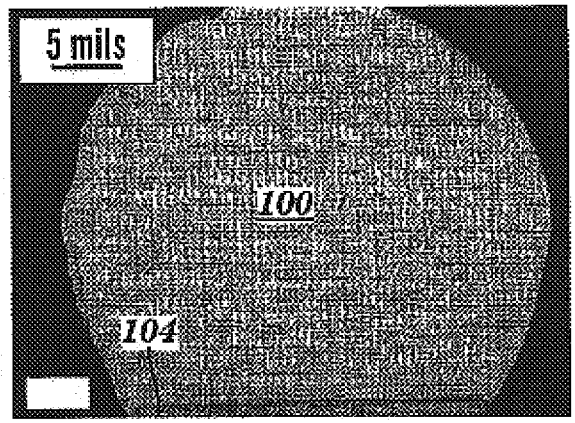

FIGS. 9A–9C are cross-sectional images of a SAC alloy solder ball 100 after being reflow-soldered to a nickel-gold pad 104 at cooling rates of 3.0° C./sec, 1.2° C./sec, and 0.2° C./sec in FIGS. 9A, 9B, and 9C, respectively, in accordance with embodiments of the present invention. The solder ball 100 comprised a Sn-3.5Ag alloy prior to its attachment to the pad 104. The pad 104 has a 24-mil linear dimension across the pad 104 surface. The undercooling relative to 217° C. was estimated to be in the range of about 15–25° C. for FIGS. 9A–9C, based on thermocouple measurements using identical or analogous circuit card assemblies. FIGS. 9A, 9B, and 9C each show at most very small $Ag_3Sn$ plates at each of the three cooling rates of 3.0, 1.2, and 0.2° C./sec, respectively. It is noted that Cu is not a component of the solder ball 100 alloy. Thus, FIGS. 9A–9C show that, even though the Ag concentration by weight is high (i.e., 3.5%), $Ag_3Sn$ plates are substantially suppressed from being formed in the Sn-3.5Ag alloy solder ball 100 (which does not comprise copper) when the cooling rate is in the range of 0.2 to 3.0° C./sec. This suggests that the absence of copper substantially suppresses large $Ag_3Sn$ plate formation when a solder ball alloy comprising tin and silver (but not copper) is cooled below 217° C.

Figure 10A:
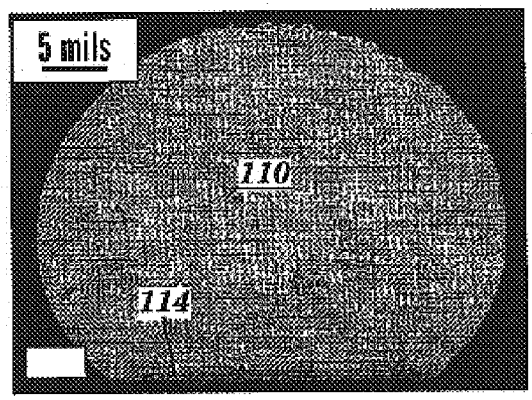
FIGS. 10A–10C depict cross-sectional images of a Sn-3.5Ag solder ball after being reflow-soldered to a copper pad at cooling rates spanning 0.2 to 3.0° C./sec, in accordance with embodiments of the present invention.
Figure 10B:
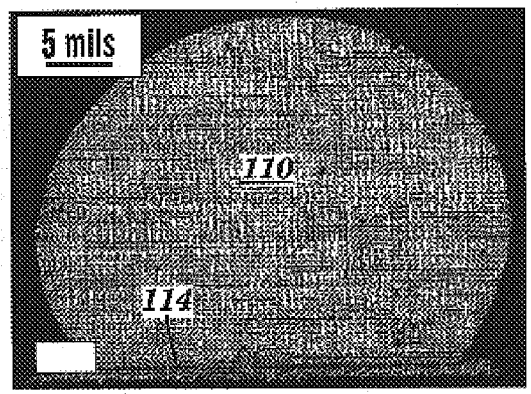
Figure 10C:
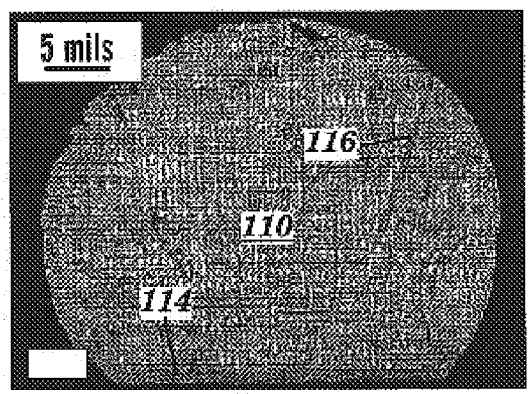

FIGS. 10A–10C are cross-sectional images of a SAC alloy solder ball 110 after being reflow-soldered to a copper pad 114 at cooling rates of 3.0° C./sec, 1.2° C./sec, and 0.2° C./sec in FIGS. 10A, 10B, and 10C, respectively, in accordance with embodiments of the present invention. The solder ball 110 comprised a Sn-3.5Ag SAC alloy prior to its attachment to the pad 114. The pad 114 has a 25-mil linear dimension across the pad 114 surface. The undercooling relative to 217° C. was estimated to be in the range of about 15–25° C. for FIGS. 10A–10C, based on thermocouple measurements using identical or analogous circuit card assemblies. FIGS. 10A and 10B each show at most very small $Ag_3Sn$ plates at each two cooling rates of 3.0 and 1.2° C./sec, respectively. In contrast, FIG. 10C shows formation of the large $Ag_3Sn$ plate 116 at the cooling rate of 0.2° C./sec. Although Cu is not a component of the solder ball 110 alloy prior to being heated and reflowed, existence of the $Ag_3Sn$ plate 116 together with the results discussed supra for FIGS. 9A–9C suggests that some copper has migrated from the pad 114 into the solder ball 110. Thus, the combined results shown on FIGS. 10A–10C and 9A–9C suggest that copper may facilitate or augment the nucleation of the $Ag_3Sn$ plates. The inventors of the present invention have also determined that an addition of bismuth similarly facilitates or augments the nucleation of the $Ag_3Sn$ plates. Nonetheless, if the Ag concentration is sufficiently small (i.e., below the cutoff Ag concentration as discussed supra), then an addition of bismuth cannot facilitate or augment the nucleation of the $Ag_3Sn$ plates. Note that an addition of bismuth may prevent formation of tin pest as will be discussed infra.

Figure 11:
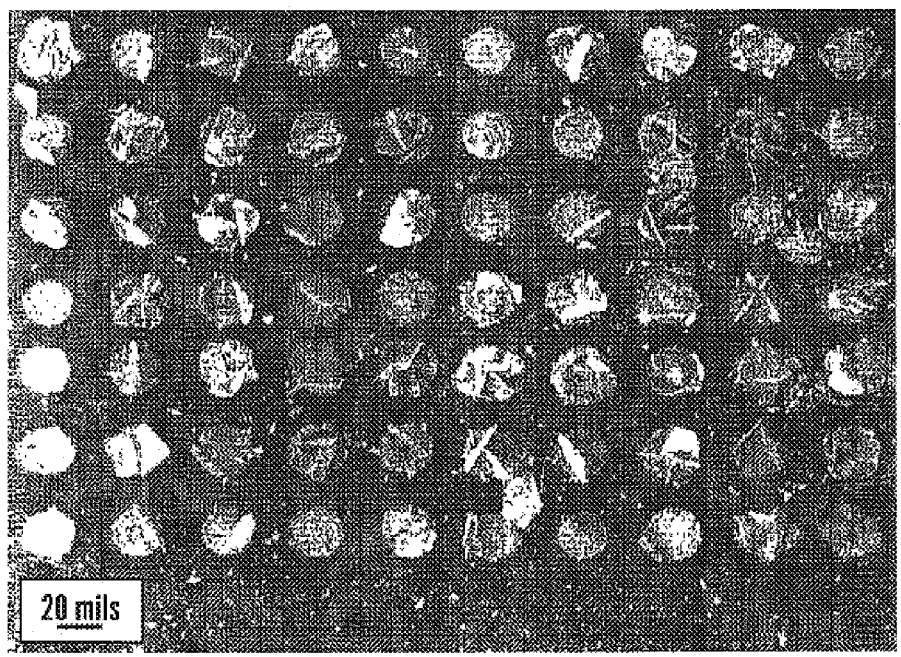
FIG. 11 is an image of a top view of silver-tin plates of Sn-3.8Ag-0.7Cu solder balls formed on an array of BGA pads wherein the majority tin component of the solder ball has been etched away, in accordance with embodiments of the present invention.
Figure 12:
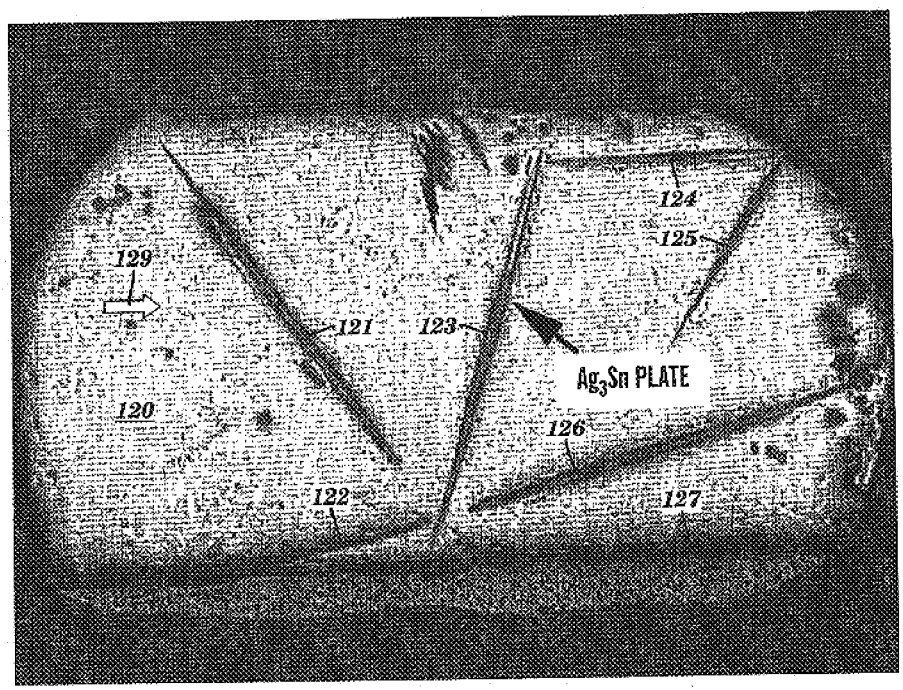
FIG. 12 is a cross-sectional image of a Sn-3.8Ag-0.7Cu solder ball joint having silver-tin plates of differing angular orientations, in accordance with embodiments of the present invention.

FIGS. 11–13 depict the morphology and geometry of $Ag_3Sn$ plates in the SAC solder alloy, in accordance with embodiments of the present invention.

FIG. 11 is an optical image of a top view of $Ag_3Sn$ plates in SAC alloy solder balls attached to an array of BGA pads, wherein the majority Sn component of the SAC alloy has been etched away in FIG. 11 so that only the $Ag_3Sn$ and $Cu_6Sn_5$ components of the SAC alloy remain on the BGA pads, in accordance with embodiments of the present invention. The SAC alloy solder balls had been formed after being reflow-soldered to nickel-gold pads at a cooling rates of 0.02° C./sec. The solder balls comprised a Sn-3.8Ag-0.4Cu SAC alloy prior to their being reflow-soldered to the BGA pads. The pads each have a 25-mil linear dimension across the pad surface. The pads appear in FIG. 11 as having approximately circular or slightly elliptical shapes and are organized in an ordered matrix pattern. The $Ag_3Sn$ plates appear in FIG. 11 as plate structures on top of the BGA pads. The largest measured $Ag_3Sn$ plate dimension parallel to the pad surfaces is about 30 mils (i.e., 762 microns). The dimension parallel to the pad surfaces of the distorted hexagonal $Cu_6Sn_5$ rods is typically about at 0.5 mils (i.e., 13 microns). The Ag$_3$Sn plate morphology in FIG. 11 is highly variable. Due to the variable Ag$_3$Sn plate orientation with respect to the viewing direction that is normal to the pad surfaces, some Ag$_3$Sn plates appear plate-like while other Ag$_3$Sn plates appear needle-like.

FIG. 12 is a cross-sectional image of a SAC alloy solder ball 120 on a nickel-gold pad 127, wherein the solder ball 120 comprises Ag$_3$Sn plates 121–126 with differing angular orientations, in accordance with embodiments of the present invention. The solder ball 120 comprised a Sn-3.8Ag-0.7Cu alloy prior to its attachment to the pad 127. The angles of the Ag$_3$Sn plates 121–126 with respect to the direction 129 vary from slightly above zero degrees for the Ag$_3$Sn plate 124 to slightly below 90 degrees for the Ag$_3$Sn plate 123. The SAC alloy solder ball had been formed after being reflow-soldered to the pad 127 at a cooling rate of 0.02° C./sec. The undercooling relative to 217° C. was estimated to be in the range of about 15–25° C., based on thermocouple measurements using identical or analogous circuit card assemblies. The pad 127 has a 28-mil linear dimension across the pad 127 surface.

FIGS. 13A–13B are images of an Ag$_3$Sn plate 130 that remained after the majority Sn component had been had been etched away from a SAC alloy solder ball that had been soldered to a pad, in accordance with embodiments of the present invention. The solder ball 120 comprised a Sn-3.8Ag-0.7Cu alloy prior to its attachment to the pad. The SAC alloy solder ball had been formed after having been subject to a cooling rate of 0.02° C./sec, after being heated above 217° C. FIG. 13B is an enlarged view of region 133 of the Ag$_3$Sn plate 130 of FIG. 13A. FIG. 13B depicts the morphology of the Ag$_3$Sn plate 130. The plate 130 was analyzed for its composition using Energy Dispersive X-ray Spectrum (EDS) technology, which confirmed that the plate 130 comprises Ag$_3$Sn. The plate 130 represents other such plates similarly analyzed as having plate lengths typically in a range of 300–500 microns and plate thicknesses typically in a range of 25–30 microns. A plate length as high as about 800 microns has been observed.

FIG. 14 is a table showing pasty range variations as a function of deviations in copper and silver concentration from a eutectic Sn-3.4Ag-0.7Cu SAC alloy, in accordance with embodiments of the present invention. The pasty range $\Delta T$ is the differential between the liquidus temperature ($T_{LIQUIDUS}$) and the solidus temperature ($T_{SOLIDUS}$) for the SAC alloy. FIG. 14 shows $\Delta T$ at two copper weight percent concentrations (0.7% and 0.9%) and at five silver weight percent concentrations (2.1%, 2.3%, 2.5%, 2.7%, and 2.9%). FIG. 14 shows $\Delta T$ in a 2–4° C. range over the five silver concentrations when the copper concentration is 0.7%, and $\Delta T$ in a 16–17° C. range over the five silver concentrations when the copper concentration is 0.9%. Thus, $\Delta T$ appears to be highly sensitive to the copper concentration but not very sensitive to the silver concentration in this hypoeutectic Ag compositional range FIG. 14 suggests that if the copper concentration is about 0.7% or lower, then the range over which the SAC alloy melts will be small based on the copper concentration alone, and the copper concentration may enlarge the melting range only by a degree or two. However, if the copper concentration is 0.9% or higher, then the two-phase temperature window over which solidification/melting occurs is much larger (e.g., at least 15° C.), which may be unacceptable because the solder defect rate in the solder joint could go up dramatically. Such solder defects include, inter alia, fillet lifting, pad lifting, solder ball lifting, etc., all of which may cause an open-circuit in the solder joint. Thus, depending on how significant the pasty range is in an intended application, it may be desirable for the copper concentration in the SAC solder ball to be no higher than 0.7, 0.8, 0.9 weight percent. Generally, the pasty range can be controlled by the copper weight percent concentration in the SAC alloy in a manner that reflects the intended application. Thus, depending on the application, the pasty range may be controlled so as to be no more than a value such as 1° C., 3° C., 5° C., 10° C., 15° C., 25° C., etc.

The preceding FIG. 14 results may be applied to the effect of soldering a SAC solder ball to either a copper pad or a nickel gold pad for the case in which the initial Cu concentration in the solder ball (i.e., the Cu concentration prior to reflow) is about 0.7%. If the pad is a copper pad, then during heating and reflow, copper in the pad migrates to the liquid solder ball which could raise the Cu concentration in the solder ball to 1.0% in just two or three reflows. At each successive reflow, the copper concentration in the solder ball increases until the copper concentration in the liquid tin reaches saturation. If more copper were added when the copper concentration is at the saturated copper concentration, the excess copper would come out of solution as a Cu$_6$Sn$_5$ precipitant. The saturated copper concentration is temperature dependent and is about 1.5% at about 250° C. One could, of course, start with a SAC solder ball having a copper concentration of 1.5% prior to the solder ball being solder reflowed to a copper pad.

If it is desired to prevent the SAC solder ball from having a final Cu concentration (i.e., an after-reflow Cu concentration) of no more than about 0.7%, the initial Cu concentration in the solder ball may be set to no more than about 0.4 or 0.5%. These considerations also apply to other solderable surface finishes such as immersion Ag and Pd surface finishes having thin surface plating. In these instances, the thin surface plating is readily dissolved in the solder during a single reflow. Under these conditions, the underlying Cu pad is typically exposed to the solder and the Cu concentration in the solder joint can rise, accordingly. If the pad is a nickel-gold pad, however then during heating and reflow, the nickel in the intermetallic phase at the pad interface ties up a substantial portion of the total fraction of the initial copper in the solder ball, causing the copper concentration of the solder ball to drop. Thus if the initial Cu concentration is about 0.7% and if the SAC solder ball is soldered to a nickel-gold pad, then the copper concentration of the SAC solder ball could be reduced to 0.4% in just 2 or 3 reflows. Thus, there is a wide range of copper that is comprised by the after-reflow solder ball depending on the pad material to which the solder ball has been soldered. However, lowering the Cu concentration is not adverse from a pasty range point of view, as explained supra, and it may therefore desirable for the after-reflow Cu concentration in the solder ball to be at or below the eutectic Cu concentration of about 0.7% so that the pasty range is reasonably bounded to no more than about two or three ° C. Accordingly, if the same solder ball alloy concentrations are used for both types of pads (i.e., a copper pad or a nickel-gold pad), then the initial copper concentration may be about 0.5 or 0.6%, so that the final copper concentration would end up at about 0.2% for a nickel-gold pad and at about 0.7% for a copper pad, depending on the number of reflow cycles.

Generally, there is no requirement for a lower bound of copper concentration in the SAC alloy. Nonetheless, the melting temperature of the eutectic tin-silver alloy is 221° C., and as copper is added to the eutectic tin-silver alloy the melting temperature decreases monotonically as the cooper weight percent increases such that the melting temperature is reduced to about 217° C. as the copper weight percent concentration is increased to the 0.7%–0.9% range. Since having a lower melting temperature for copper may be significant for some applications, it may be desirable for some applications for the copper weight percent concentration concentration to be at least about Y%, wherein representative values of Y% are 0.1%, 0.2%, 0.3%, 0.4%, 0.5%, 0.6%, and 0.7%.

In utilizing the present invention, the solder paste composition may be taken into account. For example, a commercial solder paste having 4.0Ag is in widespread use currently. If a purchaser of the SAC solder ball utilizes the 4.0Ag solder paste with a SAC solder ball of the present invention, the SAC solder ball Ag concentration may be adjusted downward to compensate for the additive Ag effect of the solder paste by 0.2%, and another 0.2% based on a tolerance used by manufacturers of the SAC solder ball. Thus, if 2.7Ag or 2.8Ag is the maximum desirable Ag concentration of the solder joint associated with the solder ball, then the initial Ag concentration of the solder ball may be reduced by 0.4% to account for both the solder paste composition and the solder ball manufacturer's compositional tolerance. Accordingly, the manufacturer would produce modules with a solder ball Ag concentration close to 2.3%. Note that the preceding numbers are merely illustrative, since the Ag concentration in the solder paste may vary and the manufacturer's solder ball tolerance may vary. Generally, the initial Ag concentration of the solder ball may be additively reduced by both the effect of the Ag concentration of the solder paste and the solder ball manufacturer's compositional tolerance. Thus, in many embodiments the Ag concentration of the solder joint exceeds the initial Ag concentration of the solder ball by at least about 0.2% (e.g., by 0.4% in the preceding example). Also note that if the Ag concentration of the solder paste is less than the desired Ag concentration of the SAC solder ball, then the effect of the solder paste on adjusting the initial Ag concentration of the SAC solder ball would be subtractive rather than additive.

Another aspect of the present invention involves adding at least 0.1% bismuth (Bi) (e.g., 0.1% to 0.2% bismuth) to the SAC solder ball to prevent tin pest from occurring. Tin pest may occur at a temperature well below room temperature and is characterized by an allotropic phase transformation of tin which transforms the normal tetragonal structure of tin ("white tin") into a body-centered cubic structure of tin(i.e., a "grey tin" powder). The transformation from white tin to grey tin destroys the mechanical properties of the structure that comprises the tin. The bismuth additive will suppress tin pest. Another additive that will suppress tin pest is antimony (Sb). However, bismuth is less toxic than antimony under some conditions associated with recycling of electronic assembly materials. Nonetheless, either bismuth or antimony may be added to the SAC solder ball of the present invention. Higher levels of bismuth and antimony may, in some instances, be added to improve solder wetting and/or the mechanical properties of the solder joints. Additionally, any additive that is known to a person of ordinary skill in the art as useful for suppressing tin pest may be added to the SAC solder ball of the present invention.

Figure 15:
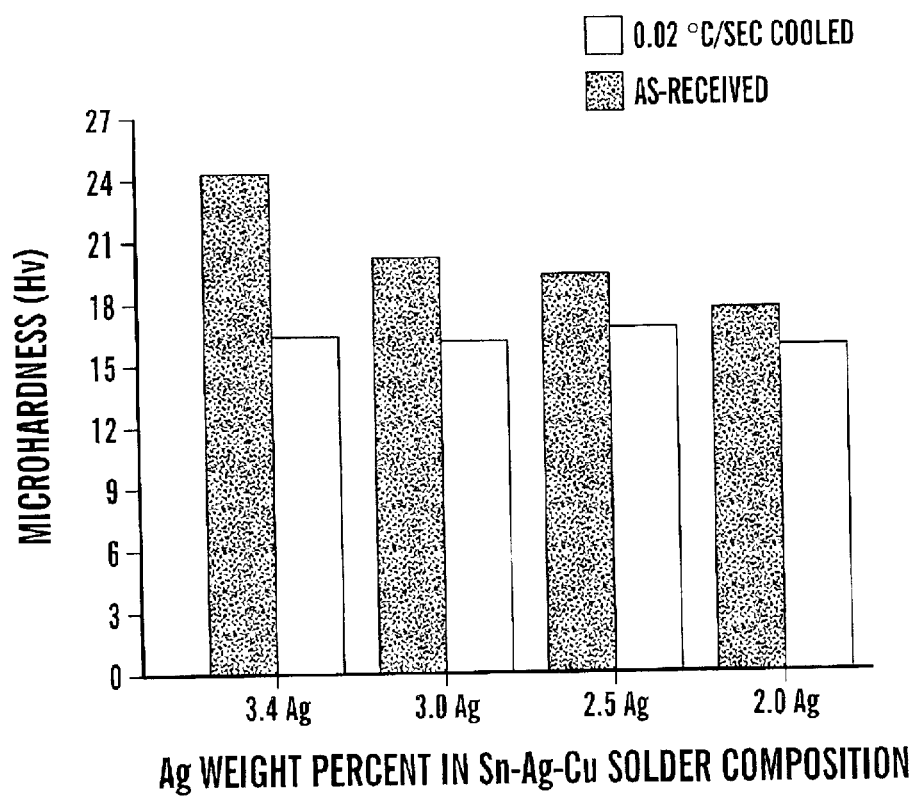
FIG. 15 is a bar chart showing microhardness as a function of Ag weight percent concentration and cooling rate for a Sn—XAg-0.9Cu SAC alloy wherein X is weight percent silver, in accordance with embodiments of the present invention.
Figure 16:
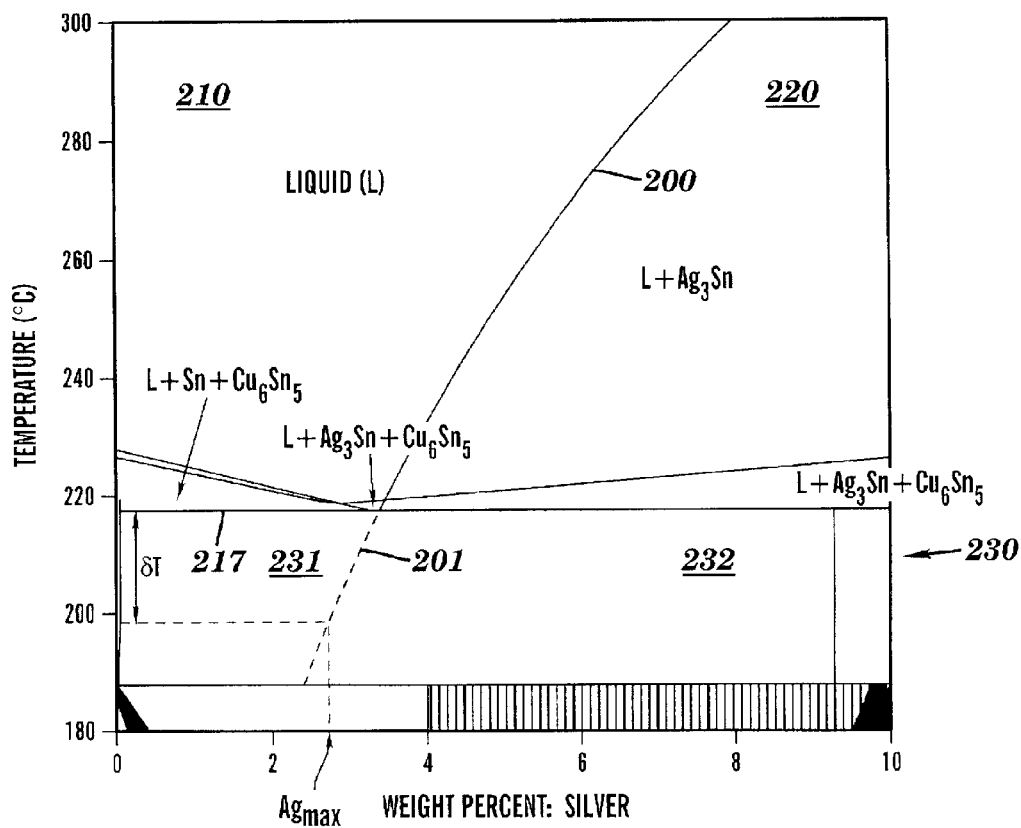
FIG. 16 depicts a section of the ternary Sn—Ag—Cu phase diagram, having a constant Cu concentration of 0.7 wt. %, in accordance with embodiments of the present invention.

FIG. 15 is a bar chart resulting from microhardness tests conducted at a Vicker's force level of 10 grams. FIG. 15 shows microhardness as a function of Ag weight percent concentration and cooling rate for a Sn—XAg-0.9Cu SAC alloy wherein X is weight percent silver, in accordance with embodiments of the present invention. Note that with respect to having higher thermal cycle fatigue life, relatively lower values of microhardness are more desirable than relatively higher values of microhardness. In FIG. 15, the lighter bars denote a SAC alloy tested for microhardness after having been formed at a cooling rate of 0.02° C./sec. The black bars denote a SAC alloy tested for microhardness as received from the SAC alloy vendor and said as-received SAC alloy had been formed at a very rapid cooling rate (i.e., much more rapid than 0.02° C./sec). Let $\Delta H$ denote a differential in hardness between the as-received alloy and the 0.02° C./sec cooled alloy, at a given value Z of silver concentration in weight percent FIG. 15 shows much larger values of $\Delta H$ at the highest value of Z (i.e., at 3.0Ag–3.4Ag) than at the lowest values of Z (i.e., at 2.0Ag–2.5Ag). At 2.0Ag–2.5Ag, $\Delta H$ is only 2 to 3 Hv. The relatively large values of $\Delta H$ at 3.0Ag–3.4Ag (i.e., 4 to 8 Hv) are likely caused by the presence of $Ag_3Sn$ plates in the slowly cooled condition and the absence of large plates in the rapidly cooled condition. In both types of solidified structures, the same amount of $Ag_3Sn$ exits; however, the $Ag_3Sn$ is dispersed differently in the two solidified structures leading to the hardness variation. The $Ag_3Sn$ incorporated in the large plates takes away material that can later be incorporated in the Sn matrix as finely dispersed $Ag_3Sn$ particulates upon final solidification. The dispersed fine particulates of $Ag_3Sn$ are arrayed in dense web like patterns between the Sn dendritic structures. These structures are distributed evenly across the solder joint. However, the density of these structures increases as the Ag concentration in the liquid phase which undergoes the final solidification (producing the solid Sn phase) increases. These more dense structures manifest higher hardnesses. The relatively small values of $\Delta H$ at 2.0Ag–2.5Ag (where $Ag_3Sn$ plate formation is suppressed in accordance with the present invention) is desirable, since the microhardness is insensitive to the processing conditions that are used to assemble a SAC solder ball to a circuit card.

FIG. 16 depicts a section (i.e., a cut) at a constant Cu concentration of 0.7 wt. % of the ternary Sn—Ag—Cu phase diagram, in accordance with embodiments of the present invention. In the pure liquid region 210, which is located to the left of the liquidus line 200 as shown, $Ag_3Sn$ cannot exist in equilibrium; i.e., $Ag_3Sn$ cannot nucleate and grow. If $Ag_3Sn$ were present in the pure liquid region 210, then the $Ag_3Sn$ would dissolve back into the pure liquid of region 210. In region 220, which is located to the right of the liquidus line 200 as shown, $Ag_3Sn$ can nucleate and grow; $Ag_3Sn$ plates can therefore exist in region 220. The region 230 lies below the eutectic melting line 217 of 217° C. In the region 230, the Sn liquid phase is substantially metastable and cannot easily nucleate. Independent measurements by the inventors of the solidification process in the Sn-3.8Ag-0.7 Cu alloy, using differential scanning calorimetry at scan rates of 0.1° C./sec, have shown undercoolings of 15° C. to 30° C. before the Sn phase solidifies. The metastability of the liquid Sn phase depends on the availability of sites for heterogeneous nucleation to take place.

Extrapolated line 201 represents an extrapolation of the liquidus line 200 below the eutectic melting line 217 into the metastable region 230. The extrapolated line 201 is nonlinear and is formed by extrapolation that takes the curvature of the liquidus line 200 into account. The region 230 has two portions: a portion 231 to the left of the extrapolated line 201, and a portion 232 to the right of the extrapolated line 201. A ternary phase transformation under equilibrium conditions would require essentially no undercooling and would enable solidification (i.e., crystallization) of all three phases (i.e., the Sn, $Ag_3Sn$, and $Cu_6Sn_5$ phases) at 217° C. With the ternary system in FIG. 16, there is no ternary phase transformation, because the tin phase is not easily nucleated, but rather is easily supercooled (i.e., undercooled) in the liquid state and is thus metastable substantially below the line 217 of 217° C. The extrapolated line 201 has the thermodynamic characteristics of the liquidus line 200 under this metastable condition. Therefore, in the portion 231 of the region 230, $Ag_3Sn$ cannot exist in equilibrium and thus cannot nucleate and grow. Accordingly, if a given amount of undercooling ($\delta T$) below the line 217 is assumed, then the extrapolated line 201 may be used to infer the maximum Ag weight percent ($Ag_{MAX}$) that will place the ternary mixture in the portion 231 of the region 230. Thus if the Ag weight percent is $Ag_{MAX}$ and the temperature is at least 217° C.-$\delta T$, then solidified $Ag_3Sn$ is thermodynamically barred from being formed, because the ternary composition is in the portion 231 of the region 230. As a first example, if $\delta T=10°$ C. then $Ag_{MAX}=3.0\%$, from use of the extrapolated line 201. As a second example, if $\delta T=20°$ C. then $Ag_{MAX}=2.7\%$, from use of the extrapolated line 201. As a third example, if $\delta T=30°$ C. then $Ag_{MAX}=2.5\%$, from use of the extrapolated line 201. The preceding values of $Ag_{MAX}$ were not determined graphically from FIG. 16, but were determined numerically by using the nonlinear equation that represents the extrapolated line 201. Thus if the temperature is at least 207° C., 197° C., or 187° C., then the $Ag_3Sn$ cannot nucleate if the Ag weight percent is no higher than 3.0%, 2.7%, or 2.5%, respectively. The preceding model uses as a temperature baseline the eutectic temperature of 217° C. at which tin would nucleate under equilibrium conditions. The tin phase in the region 230 below 217° C. is undercooled and would nucleate if it could, but it cannot because such nucleation is kinetically inhibited. However, with sufficient undercooling $\delta T$, the tin phase will nucleate. Typically, such sufficient undercooling $\delta T$ is about 15–25° C. based on experimental data to which the inventors have access. Thus if the tin begins to nucleate at 217° C. minus 15° C., then based on the preceding calculations, the Ag concentration in the alloy should be no more than 2.8–2.9% so that the $Ag_3Sn$ cannot begin to nucleate until the temperature is 15° C. below 217° C. Similarly, if the tin begins to nucleate at 217° C. minus 25° C., then based on the preceding calculations, the Ag concentration should be no more than 2.6% so that the $Ag_3Sn$ cannot begin to nucleate until the temperature is 25° C. below 217° C. Accordingly, the maximum Ag concentration to thermodynamically prevent nucleation of $Ag_3Sn$ is 2.6% if $\delta T=25°$ C. and 2.8–2.9% if $\delta T=15°$ C. Although nucleation and growth are kinetic phenomena, the present invention thermodynamically bars the nucleation and growth from occurring, because incipient nuclei are thermodynamically unstable if the ternary composition is confined to the portion 231 of the region 230.

In relation to the preceding discussion of FIG. 16, let the silver have a weight percent concentration X in the SAC alloy. In accordance with the present invention, X is sufficiently small (such as, inter alia, by selection or by predetermination) that formation of $Ag_3Sn$ plates is substantially suppressed when the SAC alloy in a liquefied state is being solidified by being cooled to a lower temperature $T_L$ at which the solid Sn phase is nucleated. The lower temperature $T_L$ corresponds to the undercooling $\delta T$ relative to the eutectic melting temperature $T_E$ of the SAC alloy, wherein $T_E$ is about equal to 217° C. Mathematically, this means that $T_L=T_E-\delta T$.

In consideration of the magnitudes and variations in weight percent concentration of silver and copper in the SAC alloy as well as small amounts of other alloy constituents such as bismuth that may be present, as discussed supra for the present invention, the majority constituent of tin in the SAC alloy of the present invention is at least about 90%.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A solder composition, comprising a solder alloy,
wherein the alloy is substantially free of lead,
wherein the alloy includes tin (Sn), silver (Ag), and copper (Cu), and bismuth (Bi),
wherein the tin has a weight percent concentration in the alloy of at least about 90%,
wherein the silver has a weight percent concentration of X in the alloy,
wherein X is sufficiently small that formation of $Ag_3Sn$ plates is substantially suppressed when the alloy in a liquefied state is being solidified by being cooled at to a lower temperature at which the solid Sn phase is nucleated,
wherein the lower temperature corresponds to an undercooling $\delta T$ relative to the eutectic melting temperature of the alloy,
wherein the copper has a weight percent concentration in the alloy not exceeding about 1.5%, and
wherein the bismuth has a weight percent concentration in the alloy from 0.1% to about 0.2%.

2. The composition of claim 1, wherein the copper weight percent concentration of the tin in the alloy is in a range of 90% to 95%.

3. The composition of claim 1, wherein the copper weight percent concentration in the liquefied alloy does not exceed about 0.9%.

4. The composition of claim 1, wherein X does not exceed about 2.8%.

5. The composition of claim 1, wherein X is in a range of about 2.6% to about 2.8%.

6. A method for forming an electrical structure, comprising:
providing a first substrate and a first solder ball attached to a first electrically conductive pad that is coupled to the first substrate, wherein the first solder ball comprises a solder alloy, wherein the alloy is substantially free of lead, wherein the alloy includes tin (Sn), silver (Ag), and copper (Cu), wherein the tin has a weight percent concentration in the alloy of at least about 90%, and wherein the copper has a weight percent concentration in the alloy not exceeding about 1.5%;
providing a second substrate and a second electrically conductive pad coupled to the second substrate;
coupling the first solder ball to the second pad;
melting the first solder ball by heating the first solder ball to form a modified solder ball; and
solidifying the modified solder ball by cooling the modified solder ball to a lower temperature at which the solid Sn phase is nucleated, and wherein the lower temperature corresponds to an undercooling $\delta T$ relative to the eutectic melting temperature of the alloy, wherein the solidified modified solder ball is a solder joint that couples the first substrate to the second substrate, and wherein a silver weight percent concentration $X_2$ in the modified solder ball is sufficiently small that formation of $Ag_3Sn$ plates is substantially suppressed during said cooling, and wherein said cooling the modified solder ball is at a cooling range of about 1.2° C./sec to about 3.0° C./sec.

7. The method of claim 6, wherein the alloy further includes antimony at a weight percent sufficient to suppress tin pest formation in the solidified modified solder ball.

8. The method of claim 6, wherein $X_2$ does not exceed $X_{MAX}$, wherein $X_{MAX}$ is the maximum silver weight percent concentration in the modified solder ball at which $Ag_3Sn$ plates are thermodynamically barred from being formed in the modified solder ball during said cooling.

9. The method of claim 8, further comprising determining $X_{MAX}$ as a function of δT from a ternary phase diagram and associated thermodynamic data relating to a ternary mixture of Sn, Ag, and Cu.

10. The method of claim 6, wherein the first substrate comprises a chip carrier, and wherein the second substrate comprises a circuit card.

11. The method of claim 10, wherein the first solder ball is a ball grid array (BGA) solder ball.

12. The method of claim 6, wherein the first substrate comprises a chip, and wherein the second substrate comprises a chip carrier.

13. The method of claim 6, wherein $X_2$ does not exceed about 2.8%.

14. The method of claim 6, wherein the copper weight percent concentration in the modified solder ball does not exceed about 0.9%.

15. The method of claim 6, wherein the weight percent concentration of the tin in the alloy is in a range of 90% to 95%.

16. The method of claim 6, wherein the second pad is a copper pad, and wherein the copper weight percent concentration in the first solder ball does not exceed about 0.5%.

17. The method of claim 6, wherein the second pad is a nickel-gold pad.

18. The method of claim 6, wherein the alloy further includes bismuth, and wherein the bismuth has a weight percent concentration in the alloy from 0.1% to about 0.2%.

19. The method of claim 6, wherein coupling the first solder ball to the second pad comprises applying a flux to the second pad and placing the first solder ball in contact with the flux.

20. The method of claim 6,
wherein coupling the first solder ball to the second pad comprises applying a solder paste to the second pad and placing the first solder ball in contact with the solder paste, and
wherein melting the first solder ball comprises melting the first solder ball and the solder paste by heating the first solder ball and the solder paste, such that the melted solder paste is incorporated into the melted first solder ball to form the modified solder ball, and such that the modified solder ball includes the solder paste within the first solder ball.

21. The method of claim 20, wherein the solder paste includes a weight percent silver $X_P$ that exceeds the silver weight percent concentration $X_1$ in the alloy of the first solder ball, and wherein $X_P-X_1$ is at least 0.2%.

22. A method for forming a solder composition, comprising:
providing a solder alloy, wherein the alloy is substantially free of lead, wherein the alloy includes tin (Sn), silver (Ag), and copper (Cu), wherein the tin has a weight percent concentration in the alloy of at least about 90%, wherein the silver has a weight percent concentration in the alloy not exceeding about 4.0%, and wherein the copper has a weight percent concentration in the alloy not exceeding about 1.5%;
melting the alloy by heating the alloy; and
solidifying the melted alloy by cooling the melted alloy at a cooling rate in a range of about 1.2° C./sec to about 3.0° C./sec.

23. The method of claim 22, further comprising, prior to said solidifying, selecting the cooling rate that is high enough to substantially suppress said $Ag_3Sn$ plate formation in the alloy.

24. The method of claim 22, wherein the weight percent concentration of the silver in the alloy does not exceed about 2.8%.

25. The method of claim 22, wherein the weight percent concentration of the tin in the alloy is in a range of 90% to 95%.

26. The method of claim 22, wherein the copper weight percent concentration in the melted alloy does not exceed about 0.9%.

27. The method of claim 22, wherein the alloy further includes antimony at a weight percent sufficient to suppress tin pest formation in the solidified alloy.

28. The method of claim 22, wherein the alloy further comprises bismuth, and wherein the bismuth has a weight percent concentration of at least 0.1% to about 0.2%.

29. A method for forming an electrical structure, comprising:
providing a first substrate and a first solder ball attached to a first electrically conductive pad that is coupled to the first substrate, wherein the first solder ball comprises a solder alloy, wherein the alloy is substantially free of lead, wherein the alloy includes tin (Sn), silver (Ag), and copper (Cu), wherein the tin has a weight percent concentration in the alloy of at least about 90%, wherein the silver has a weight percent concentration in the alloy not exceeding about 4.0%, and wherein the copper has a weight percent concentration in the alloy not exceeding about 1.5%;
providing a second substrate and a second electrically conductive pad coupled to the second substrate;
coupling the first solder ball to the second pad;
melting the first solder ball by heating the first solder ball to form a modified solder ball; and
solidifying the modified solder ball by cooling the modified solder ball at a cooling rate in a range or about 1.2° C./sec to about 3.0° C./sec.

30. The method of claim 29, wherein the alloy further comprises bismuth at a weight percent concentration in the alloy from 0.1% to about 0.2.

31. The method of claim 29, wherein the first substrate comprises a chip carrier, and wherein the second substrate comprises a circuit card.

32. The method of claim 31, wherein the first solder ball is a ball grid array (BGA) solder ball.

33. The method of claim 29, wherein the first substrate comprises a chip, and wherein the second substrate comprises a chip carrier.

34. The method of claim 29, wherein the weight percent concentration of the silver in the alloy does not exceed about 2.8%.

35. The method of claim 29, wherein the weight percent concentration of the tin in the alloy is in a range of 90% to 95%.

36. The method of claim 29, wherein the copper weight percent concentration in the alloy does not exceed about 0.9%.

37. The method of claim 29, wherein the second pad is a copper pad.

38. The method of claim 29, wherein the second pad is a copper pad, and wherein the copper weight percent concentration in the first solder ball does not exceed about 0.5%.

39. The method of claim 29, wherein the second pad is a nickel-gold pad.

40. The method of claim 29, wherein the alloy further includes antimony at a weight percent sufficient to suppress tin pest formation in the modified solder ball.

41. The method of claim 29, wherein coupling the first solder ball to the second pad comprises applying a flux to the second pad and placing the first solder ball in contact with the flux.

42. The method of claim 29,
wherein coupling the first solder ball to the second pad comprises applying a solder paste to the second pad and placing the first solder ball in contact with the solder paste, and
wherein melting the first solder ball comprises melting the first solder ball and the solder paste by heating the first solder ball and the solder paste, such that the melted solder paste is incorporated into the melted first solder ball to form the modified solder ball, and such that the modified solder ball includes the solder paste within the first solder ball.

43. A pre-soldering electrical structure, comprising:
a first substrate and a first solder ball attached to a first electrically conductive pad that is coupled to the first substrate, wherein the first solder ball comprises a solder alloy, wherein the alloy is substantially free of lead, wherein the alloy includes tin (Sn), silver (Ag), and copper (Cu), and bismuth (Bi), wherein the tin has a weight percent concentration in the alloy of at least about 90%, and wherein the bismuth has a weight percent concentration in the alloy from 0.1% to about 0.2%.
a second substrate and a second electrically conductive pad coupled to the second substrate, wherein the first solder ball is coupled to the second pad, wherein the first solder ball is adapted to being melted by being heated to form a modified solder ball, wherein the modified solder ball is adapted to being solidified by being cooled to a lower temperature at which the solid Sn phase is nucleated, wherein the lower temperature corresponds to an undercooling $\delta T$ relative to the eutectic melting temperature of the alloy, wherein the solidified modified solder ball is a solder joint that couples the first substrate to the second substrate, and wherein a silver weight percent concentration $X_2$ in the modified solder ball is sufficiently small that formation of $Ag_3Sn$ plates are substantially suppressed during said cooling.

44. The electrical structure of claim 43, wherein the alloy of the first solder ball has a silver weight percent concentration $X_1$, and wherein $X_1$ has a predetermined value based on $X_2$ being sufficiently small that formation of said $Ag_3Sn$ plates is substantially suppressed during cooling of said modified solder ball.

45. The electrical structure of claim 43, wherein $X_2$ does not exceed $X_{MAX}$, wherein $X_{MAX}$ is the maximum silver weight percent concentration in the modified solder ball at which $Ag_3Sn$ plates are thermodynamically barred from being formed in the modified solder ball during said cooling.

46. The electrical structure of claim 45, wherein $X_{MAX}$ is a function of $\delta T$, said function being derived from a ternary phase diagram and associated thermodynamic data relating to a ternary mixture of Sn, Ag, and Cu.

47. The electrical structure of claim 43, wherein the first substrate comprises a chip carrier, and wherein the second substrate comprises a circuit card.

48. The electrical structure of claim 47, wherein the first solder ball is a ball grid array (BGA) solder ball.

49. The electrical structure of claim 43, wherein the first substrate comprises a chip, and wherein the second substrate comprises a chip carrier.

50. The electrical structure of claim 43, the weight percent concentration of the tin in the alloy is in a range of 90% to 95%.

51. The electrical structure of claim 43, wherein $X_2$ does not exceed about 2.8%.

52. The electrical structure of claim 43, wherein the solder paste includes a weight percent silver $X_1$, that exceeds $X_1$, wherein $X_1$ is the weight percent silver in the first solder ball, and wherein $X_2-X_1$ is at least 0.2%.

53. The electrical structure of claim 43, wherein the copper weight percent concentration in the modified solder ball during cooling is sufficiently small that the pasty range of the modified solder ball during cooling does not exceed about 10° C.

54. The electrical structure of claim 43, wherein the copper weight percent concentration in the modified solder ball does not exceed about 0.9%.

55. The electrical structure of claim 43, wherein the second pad is a copper pad, and wherein the copper weight percent concentration in the first solder ball does not exceed about 0.5%.

56. The electrical structure of claim 43, wherein the second pad is a nickel-gold pad.

57. The electrical structure of claim 43, wherein the first solder ball is coupled to the second pad by a flux that is applied to the second pad such that the first solder ball in contact with the flux.

58. The electrical structure of claim 43,
wherein the first solder ball is coupled to the second pad by a solder paste that is applied to the second pad such that the first solder ball in contact with the solder paste; and
wherein the first solder ball is adapted to being melted by heating the first solder ball and the solder paste, such that the melted solder paste is incorporated into the melted first solder ball to form the modified solder ball, and such that the modified solder ball includes the solder paste within the first solder ball.

59. A post-soldering electrical structure comprising:
a first substrate; and
a second substrate, wherein the first substrate is coupled to the second substrate by a solder joint, wherein the solder joint comprises an alloy, wherein the alloy is substantially free of lead, wherein the alloy includes tin (Sn), silver (Ag), and copper (Cu), wherein the tin has a weight percent concentration in the alloy of at least about 90%, wherein the silver has a weight percent concentration in the alloy of $X_2$, wherein $X_2$ is sufficiently small that $Ag_3Sn$ plates are substantially absent in the solder joint, and wherein the copper has a weight percent concentration in the alloy not exceeding about 1.5%, and wherein the bismuth has a weight percent concentration in the alloy from 0.1% to about 0.2%.

60. The electrical structure of claim 59, wherein the weight percent concentration of the tin in the alloy is in a range of 90% to 95%.

61. The electrical structure of claim 59, wherein the first substrate comprises a chip carrier, and wherein the second substrate comprises a circuit card.

62. The electrical structure of claim 61 wherein the solder joint includes a ball grid array (BGA) solder ball.

63. The electrical structure of claim 59, wherein the first substrate comprises a chip, and wherein the second substrate comprises a chip carrier.

64. The electrical structure of claim 59, wherein $X_2$ does not exceed about 2.8%.

65. The electrical structure of claim 59, wherein the copper weight percent concentration in the solder joint does not exceed about 0.9%.

66. A solder composition, comprising a solder alloy, wherein the alloy is substantially free of lead, wherein the alloy includes tin (Sn), silver (Ag), copper (Cu), and bismuth (Bi), wherein the tin has a weight percent concentration in the alloy of at least about 90%, wherein the silver has a weight percent concentration of X in the alloy, wherein X is sufficiently small that formation of $Ag_3Sn$ plates is substantially suppressed when the alloy in a liquefied state is being solidified by being cooled at to a lower temperature at which the solid Sn phase is nucleated, wherein the lower temperature corresponds to an undercooling δT relative to the eutectic melting temperature of the alloy, wherein the bismuth has a weight percent concentration in the alloy from 0.1% to about 0.2%, and wherein the copper has a weight percent concentration in the alloy not exceeding about 0.9%.

67. The solder composition of claim 66, wherein the alloy further includes antimony at a weight percent sufficient to suppress tin pest formation in the alloy during a subsequent cooling of the alloy.

68. A method for forming a solder composition, comprising:

providing a solder alloy, wherein the alloy is substantially free of lead, herein the alloy includes tin (Sn), silver (Ag), and copper (Cu), wherein the tin has a weight percent concentration in the alloy in a range of 90% to 95%, wherein the silver has a weight percent concentration in the alloy not exceeding about 4.0%, and wherein the copper has a weight percent concentration in the alloy not exceeding about 1.5%;

melting the alloy by heating the alloy; and solidifying the melted alloy by cooling the melted alloy at a cooling rate that is high enough to substantially suppress $Ag_3Sn$ plate formation in the alloy during said cooling, wherein the cooling rate is in a range of about 1.2° C./sec to about 3.0° C./sec.

69. The method of claim 68, wherein the cooling rate is at least 1.2° C./sec.

70. The method of claim 68, wherein the weight percent concentration of silver in the alloy does not exceed about 2.8%.

71. A method for forming a solder composition, comprising:

providing a solder alloy, wherein the alloy is substantially free of lead wherein the alloy includes tin (Sn), silver (Ag), and copper (Cu), wherein the tin has a weight percent concentration in the alloy in a range 90% to 95%, wherein the silver has a weight percent concentration in the alloy not exceeding about 2.8%, and wherein the copper as a weight percent concentration in the alloy not exceeding about 1.5%;

melting the alloy by heating the alloy; and solidifying the melted alloy by cooling the melted alloy at a cooling rate, wherein the cooling rate is at least 1.2° C./sec.

72. The method of claim 71, wherein the cooling rate is in a range of about 1.2° C./sec to about 3.0° C./sec.

73. The method of claim 71, wherein the alloy further includes bismuth at a weight percent concentration in the alloy from 0.1% to about 0.2%.

* * * * *

UNITED STATES PATENT AND TRADEMARK OFFICE
CERTIFICATE OF CORRECTION

PATENT NO. : 6,805,974 B2 Page 1 of 1
APPLICATION NO. : 10/078020
DATED : October 19, 2004
INVENTOR(S) : Choi et al.

It is certified that error appears in the above-identified patent and that said Letters Patent is hereby corrected as shown below:

<u>Column 22</u>
Line 53, delete "and copper (Cu)," and insert -- copper (Cu) and bismuth (Bi), --
Line 58, delete "and"

Signed and Sealed this

Twenty-second Day of May, 2007

JON W. DUDAS
*Director of the United States Patent and Trademark Office*